US009177813B2

(12) United States Patent
Miura

(10) Patent No.: US 9,177,813 B2
(45) Date of Patent: Nov. 3, 2015

(54) MANUFACTURING METHOD OF SEMICONDUCTOR DEVICE

(75) Inventor: Tatsuhiko Miura, Tokyo (JP)

(73) Assignee: RENESAS ELECTRONICS CORPORATION, Kanagawa (JP)

(*) Notice: Subject to any disclaimer, the term of this patent is extended or adjusted under 35 U.S.C. 154(b) by 684 days.

(21) Appl. No.: 12/727,337

(22) Filed: Mar. 19, 2010

(65) Prior Publication Data

US 2010/0291767 A1 Nov. 18, 2010

(30) Foreign Application Priority Data

May 18, 2009 (JP) ................ 2009-119641

(51) Int. Cl.

| H01L 21/44 | (2006.01) |
|---|---|
| H01L 21/285 | (2006.01) |
| C23C 14/16 | (2006.01) |
| H01L 21/768 | (2006.01) |
| H01L 23/532 | (2006.01) |
| H01L 29/417 | (2006.01) |
| H01L 29/45 | (2006.01) |
| H01L 29/47 | (2006.01) |
| H01L 29/66 | (2006.01) |
| H01L 29/739 | (2006.01) |
| H01L 29/78 | (2006.01) |

(Continued)

(52) U.S. Cl.

CPC .......... *H01L 21/2855* (2013.01); *C23C 14/165* (2013.01); *H01L 21/28518* (2013.01); *H01L 21/76846* (2013.01); *H01L 21/76876* (2013.01); *H01L 21/76877* (2013.01); *H01L 23/53223* (2013.01); *H01L 29/41741* (2013.01); *H01L 29/41766* (2013.01); *H01L 29/456* (2013.01); *H01L 29/47* (2013.01); *H01L 29/66727* (2013.01); *H01L 29/66734* (2013.01); *H01L 29/7397* (2013.01); *H01L 29/7806* (2013.01); *H01L 29/7813* (2013.01); *H01L 29/872* (2013.01); *H01L 27/0255* (2013.01); *H01L 29/0696* (2013.01); *H01L 29/42372* (2013.01); *H01L 2924/0002* (2013.01)

(58) Field of Classification Search

None

See application file for complete search history.

(56) References Cited

U.S. PATENT DOCUMENTS

| 4,594,294 A * | 6/1986 | Eichen et al. ................ 428/552 |
|---|---|---|
| 4,619,865 A * | 10/1986 | Keem et al. .................. 428/333 |

(Continued)

FOREIGN PATENT DOCUMENTS

| EP | 1094504 A2 * | 4/2001 |
|---|---|---|
| GB | 2 339 072 A | 1/2000 |

(Continued)

*Primary Examiner* — David E Graybill
(74) *Attorney, Agent, or Firm* — Mattingly & Malur, PC

(57) ABSTRACT

In MOSFET having SBD as a protection element, a TiW (alloy having tungsten as a main component) film is used as an aluminum-diffusion barrier metal film below an aluminum source electrode in order to secure properties of SBD. The present inventors have found that a tungsten-based barrier metal film is in the form of columnar grains having a lower barrier property than that of a titanium-based barrier metal film such as TiN so that aluminum spikes are generated relatively easily in a silicon substrate. In the present invention, when a tungsten-based barrier metal film is formed by sputtering as a barrier metal layer between an aluminum-based metal layer and a silicon-based semiconductor layer therebelow, the lower layer is formed by ionization sputtering while applying a bias to the wafer side and the upper layer is formed by sputtering without applying a bias to the wafer side.

7 Claims, 18 Drawing Sheets

(51) Int. Cl.
*H01L 29/872* (2006.01)
*H01L 27/02* (2006.01)
*H01L 29/06* (2006.01)
*H01L 29/423* (2006.01)

(56) References Cited

U.S. PATENT DOCUMENTS

| | | | | |
|---|---|---|---|---|
| 4,717,632 A | * | 1/1988 | Keem et al. | 428/698 |
| 4,871,686 A | * | 10/1989 | Davies | 438/328 |
| 5,175,125 A | * | 12/1992 | Wong | 438/642 |
| 5,178,739 A | * | 1/1993 | Barnes et al. | 204/192.12 |
| 5,514,622 A | * | 5/1996 | Bornstein et al. | 438/628 |
| 5,915,179 A | * | 6/1999 | Etou et al. | 438/268 |
| 5,962,923 A | * | 10/1999 | Xu et al. | 257/774 |
| 6,080,285 A | | 6/2000 | Liu et al. | |
| 6,156,647 A | * | 12/2000 | Hogan | 438/653 |
| 6,261,648 B1 | | 7/2001 | Akiba et al. | 427/585 |
| 6,329,230 B1 | * | 12/2001 | Matsuda | 438/167 |
| 6,638,850 B1 | | 10/2003 | Inagawa et al. | 438/621 |
| 7,176,128 B2 | * | 2/2007 | Ahrens et al. | 438/643 |
| 2002/0060362 A1 | | 5/2002 | Miyamoto | 257/751 |
| 2002/0089027 A1 | * | 7/2002 | Xu et al. | 257/471 |
| 2003/0040188 A1 | * | 2/2003 | Hsu et al. | 438/697 |
| 2003/0090002 A1 | * | 5/2003 | Sugawara et al. | 257/784 |
| 2003/0199156 A1 | * | 10/2003 | Fujii | 438/597 |
| 2005/0145899 A1 | * | 7/2005 | Fujii | 257/288 |
| 2005/0202677 A1 | * | 9/2005 | Hsu et al. | 438/692 |
| 2007/0076348 A1 | * | 4/2007 | Shioga et al. | 361/307 |
| 2007/0148896 A1 | * | 6/2007 | Nakamura et al. | 438/381 |
| 2008/0117552 A1 | * | 5/2008 | Zhou et al. | 360/319 |
| 2008/0257487 A1 | * | 10/2008 | Shioga et al. | 156/249 |
| 2010/0096253 A1 | * | 4/2010 | Cao et al. | 204/192.1 |
| 2010/0187693 A1 | * | 7/2010 | Mountsier et al. | 257/751 |
| 2010/0255677 A1 | * | 10/2010 | Miura | 438/653 |
| 2010/0291767 A1 | * | 11/2010 | Miura | 438/653 |

FOREIGN PATENT DOCUMENTS

| | | | | |
|---|---|---|---|---|
| JP | 6-45281 A | | 2/1994 | |
| JP | 10-223752 A | | 8/1998 | |
| JP | 2000-21880 A | | 1/2000 | |
| JP | 2000-223708 A | | 8/2000 | |
| JP | 2001-127005 A | | 5/2001 | |
| JP | 2001-267569 A | | 9/2001 | |
| JP | 2001267569 A | * | 9/2001 | H01L 29/78 |
| JP | 2001-358091 A | | 12/2001 | |
| JP | 2003-318395 A | | 11/2003 | |
| JP | 2004-247559 A | | 9/2004 | |
| JP | 2006-32598 A | | 2/2006 | |
| JP | 2007-165663 A | | 6/2007 | |
| JP | 2010245296 A | * | 10/2010 | |

* cited by examiner

MANUFACTURING METHOD OF SEMICONDUCTOR DEVICE

CROSS-REFERENCE TO RELATED APPLICATIONS

The disclosure of Japanese Patent Application No. 2009-119641 filed on May 18, 2009 including the specification, drawings and abstract is incorporated herein by reference in its entirety.

BACKGROUND OF THE INVENTION

The present invention relates to a technology effective when applied to a metal film forming technology in a manufacturing method of a semiconductor device (or a semiconductor integrated circuit device).

Japanese Patent Laid-Open No. 2004-247559 (Patent Document 1) and U.S. Patent Publication No. 2007-0148896 (Patent Document 2) disclose a technology of forming a ruthenium film as a lower electrode of DRAM (dynamic random access memory) by sputtering according to a PCM (point cusp magnetron) system (i.e., PCM sputtering) and CVD (Chemical Vapor Deposition).

Japanese Patent Laid-Open No. 2004-358091 (Patent Document 3) and U.S. Patent Publication No. 2002-0089027 (Patent Document 4) disclose a technology of forming, by a kind of ionization sputtering, a titanium film, a titanium nitride film, or the like as a barrier metal layer for effectively filling a contact hole with aluminum.

Japanese Patent Laid-Open No. 2001-127005 (Patent Document 5) discloses a technology of forming a titanium film as a barrier metal film by sputtering based on an IMP (Ion Metal Plasma) system in order to fill aluminum in a hole with a high aspect ratio.

Japanese Patent Laid-Open No. 2000-223708 (Patent Document 6), Japanese Patent Laid-Open No. 2007-165663 (Patent Document 7), Japanese Patent Laid-Open No. 2001-267569 (Patent Document 8), and Japanese Patent Laid-Open No. 2006-32598 (Patent Document 9) disclose a technology of using TiW as a barrier metal of an aluminum source electrode of a trench gate power MOSFET (metal oxide semiconductor field effect transistor).

Japanese Patent Laid-Open No. 223752/1998 (Patent Document 10), Japanese Patent Laid-Open No. 45281/1994 (Patent Document 11), and Japanese Patent Laid-Open No. 2000-21880 (Patent Document 12) disclose a technology of forming a titanium film, a titanium nitride film (or TiW), or the like as a barrier metal layer of an aluminum interconnect by using typical sputtering.

Japanese Patent Laid-Open No. 2003-318395 (Patent Document 13), U.S. Patent Publication 2003-0199156 (Patent Document 14), and U.S. Patent Publication 2005-0145899 (Patent Document 15) disclose a technology of using TiW as a barrier metal of an aluminum source electrode of a power MOSFET and forming an aluminum source electrode by reflow.

[Patent Document 1] Japanese Patent Laid-Open No. 2004-247559
[Patent Document 2] U.S. Patent Publication 2007-0148896
[Patent Document 3] Japanese Patent Laid-Open No. 2001-358091
[Patent Document 4] U.S. Patent Publication 2002-0089027
[Patent Document 5] Japanese Patent Laid-Open No. 2001-127005
[Patent Document 6] Japanese Patent Laid-Open No. 2000-223708
[Patent Document 7] Japanese Patent Laid-Open No. 2007-165663
[Patent Document 8] Japanese Patent Laid-Open No. 2001-267569
[Patent Document 9] Japanese Patent Laid-Open No. 2006-32598
[Patent Document 10] Japanese Patent Laid-Open No. 223752/1998
[Patent Document 11] Japanese Patent Laid-Open No. 45281/1994
[Patent Document 12] Japanese Patent Laid-Open No. 2000-21880
[Patent Document 13] Japanese Patent Laid-Open No. 2003-318395
[Patent Document 14] U.S. Patent Publication 2003-0199156
[Patent Document 15] U.S. Patent Publication 2005-0145899

SUMMARY OF THE INVENTION

In MOSFET having a SBD (Schottky barrier diode) as a protection element, a TiW (an alloy comprised mainly of tungsten) film is used as an aluminum diffusion barrier metal film below an aluminum source electrode in order to secure the properties of the SBD. The investigation by the present inventors has, however, revealed that compared with a titanium-based barrier metal film such as TiN, a tungsten-based barrier metal film is in the form of columnar grains inferior in barrier property so that aluminum spikes occur in a silicon substrate relatively easily.

The invention has been made with a view to overcoming the above-described problem.

An object of the invention is to provide a high reliability manufacturing process of a semiconductor device.

The above-described and the other objects and novel features of the invention will be apparent from the description herein and accompanying drawings.

Of the inventions disclosed herein, typical ones will be described briefly as follows.

According to one mode of the present application, when a tungsten-based barrier metal film is formed by sputtering as a barrier metal layer between an aluminum-based metal layer and a silicon-based semiconductor layer, the lower layer of it is formed by carrying out ionization sputtering while applying a bias to the wafer side and the upper layer of it is formed by sputtering without applying a bias to the wafer side.

Typical advantages, among advantages available by the invention disclosed herein, will next be described briefly.

When a tungsten-based barrier metal film is formed by sputtering as a barrier metal layer between an aluminum-based metal layer and a silicon-based semiconductor layer lying therebelow, the lower layer of it is formed by ionization sputtering while applying a bias to the wafer side and the upper layer of it is formed by sputtering without substantially applying a bias to the wafer side. This enables to yield a tungsten-based barrier metal film whose lower portion is in an amorphous form superior in barrier property.

DETAILED DESCRIPTION OF THE INVENTION

Outline of Embodiment

Figure 1:
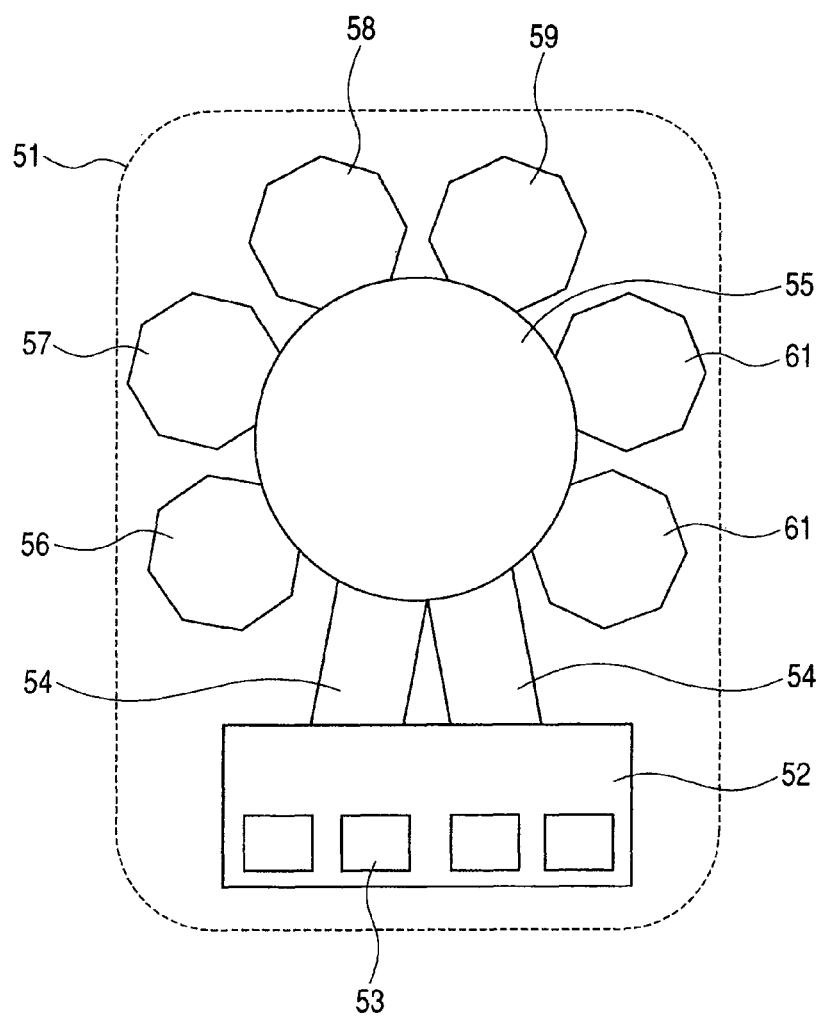
FIG. 1 is a plan view illustrating the configuration of a multi-chamber type wafer processing apparatus to be used for a manufacturing method of a semiconductor device according to one embodiment of the present application.

First, typical embodiments of the invention disclosed herein are outlined.

1. A manufacturing method of a semiconductor device including the following steps: (a) forming a recess downwards from the upper surface of a first insulating film over a first main surface of a semiconductor wafer; (b) forming a tungsten-based barrier metal film over the inner surface of the recess and the upper surface of the first insulating film; (c) after the step (b), forming an aluminum-based metal layer to cover therewith the tungsten-based barrier metal film over the inner surface of the recess and the upper surface of the first insulating film; wherein the step (b) includes the following sub-steps: (b1) forming a first-layer film of the tungsten-based barrier metal film over the inner surface of the recess and the upper surface of the first insulating film by ionization sputtering while applying a bias voltage to the semiconductor wafer; and (b2) forming a second-layer film of the tungsten-based barrier metal film over the first layer film by sputtering without substantially applying a bias voltage to the semiconductor wafer.

2. The manufacturing method of a semiconductor device as described above in 1, wherein in the step (b), the tungsten-based barrier metal film contains tungsten as a main component thereof and titanium as a secondary component.

3. The manufacturing method of a semiconductor device as described above in 1 or 2, wherein the first-layer film has mainly an amorphous structure.

4. The manufacturing method of a semiconductor device as described above in any one of 1 to 3, wherein the second-layer film has mainly a columnar crystal structure.

5. The manufacturing method of a semiconductor device as described above in any one of 1 to 4, wherein the sub-steps (b1) and (b2) are performed in a same film forming chamber.

6. The manufacturing method of a semiconductor device as described above in any one of 1 to 4, wherein the sub-steps (b1) and (b2) are performed in film forming chambers different from each other.

7. The manufacturing method of a semiconductor device as described above in any one of 1 to 6, wherein the sub-step (b2) is carried out without substantially applying a radio frequency bias voltage to a sputter target.

8. The manufacturing method of a semiconductor device as described above in any one of 1 to 7, wherein the semiconductor wafer has, over the first main surface thereof, a number of semiconductor chip regions and a Schottky barrier diode is formed in each of the chip regions.

9. The manufacturing method of a semiconductor device as described above in 8, wherein a power MOSFET is formed in each of the chip regions.

10. The manufacturing method of a semiconductor device as described above in any one of 1 to 9, wherein the recess has a two-stage structure.

11. A manufacturing method of a semiconductor device including the following steps: (a) forming a recess downwards from the upper surface of a first insulating film over a first main surface of a semiconductor wafer; (b) forming a tungsten-based barrier metal film over the inner surface of the recess and the upper surface of the first insulating film by ionization sputtering while applying a bias voltage to the semiconductor wafer; and (c) after the step (b), forming an aluminum-based metal layer to cover therewith the tungsten-based barrier metal film over the inner surface of the recess and the upper surface of the first insulating film.

12. The manufacturing method of a semiconductor device as described above in 11, wherein in the step (b), the tungsten-based barrier metal film contains tungsten as a main component thereof and titanium as a secondary component.

13. The manufacturing method of a semiconductor device as described above in 11, wherein the tungsten-based barrier metal film has a layer having mainly an amorphous structure.

14. The manufacturing method of a semiconductor device as described above in 11 or 12, wherein the semiconductor wafer has, over the first main surface thereof, a number of semiconductor chip regions and a Schottky barrier diode is formed in each of the chip regions.

15. The manufacturing method of a semiconductor device as described above in 14, wherein a power MOSFET is formed in each of the chip regions.

16. The manufacturing method of a semiconductor device as described above in any one of 11 to 15, wherein the recess has a two-stage structure.

[Explanation of Description Manner, Basic Terms, and Usage in the Present Application]

1. In the present application, a description in the embodiments may be made after divided in plural sections if necessary for convenience's sake. These plural sections are not independent each other, but they may each be a part of a single example or one of them may be a partial detail of the other or a modification example of a part or whole of the other one unless otherwise specifically indicated. In principle, description on a portion similar to that described before is not repeated. Moreover, when a reference is made to constituent elements in the embodiments, they are not essential unless otherwise specifically indicated, limited to the number theoretically, or principally apparent from the context that it is not.

Further, the term "semiconductor device" as used herein means mainly a simple device such as various transistors (active elements) or a device obtained by integrating such a simple device as a main element with a resistor, a capacitor, and the like over a semiconductor chip or the like (for example, a single-crystal silicon substrate). It should be noted that a simple device is obtained by integrating a plurality of minute elements. Typical examples of the various transistors include MISFET (metal insulator semiconductor field effect transistor) typified by MOSFET (metal oxide semiconductor field effect transistor) and IGBT (insulated gate bipolar transistor). Further, even in the "MOS", an insulating film is not limited to that made of an oxide.

2. Similarly, with regard to any material, any composition or the like in the description of the embodiments, the term "X made of A" or the like does not exclude X having, as one of the main constituent components thereof, an element other than A unless otherwise specifically indicated or principally apparent from the context that it is not. For example, the term "X made of A" means that "X has A as a main component thereof". It is needless to say that, for example, the term "silicon member" is not limited to a member made of pure silicon but also means a member made of an SiGe alloy or another multi-element alloy having silicon as a main component or a member containing an additive in addition. Similarly, the term "silicon oxide film", "silicon oxide-based insulating film", or the like is not limited to a relatively pure undoped silicon oxide (undoped silicon dioxide) but needless to say, it embraces FSG (fluorosilicate glass) film, TEOS-based silicone oxide film, SiOC (silicon oxycarbide) film, or carbon-doped silicon oxide film, a thermal oxidation film such as OSG (organosilicate glass) film, PSG (phosphorus silicate glass) film, or BPSG (borophosphosilicate glass) film, a CVD oxide film, silicon oxide films obtained by the method of application such as SOG (spin on glass) and nano-clustering silica (NSC) film, silica-based low-k insulating films (porous insulating films) obtained by introducing pores into members similar to them, and composite films with another silicon-based insulating film which films contain any one of the above-mentioned films as a principal constituent element.

In addition, silicon-based insulating films ordinarily used in the semiconductor field like silicon oxide based insulating films are silicon nitride based insulating films. Materials which belong to such a group include SiN, SiCN, SiNH, and SiCNH.

3. Preferred examples of the shape, position, attribute, and the like will be shown below, however, it is needless to say that the shape, position, attribute, and the like are not strictly limited to these preferred examples unless otherwise specifically indicated or apparent from the context that it is not.

4. When a reference is made to a specific number or amount, the number or amount may be greater than or less than the specific number or amount unless otherwise specifically indicated, limited to the specific number or amount theoretically, or apparent from the context that it is not.

5. The term "wafer" usually means a single crystal silicon wafer over which a semiconductor device (which may be a semiconductor integrated circuit device or an electronic device) is to be formed. It is however needless to say that it embraces a composite wafer of a semiconductor layer and an insulating substrate such as epitaxial wafer, SOI substrate, or LCD glass substrate.

6. "Ionization sputtering" is one of directive sputtering methods. Compared with typical metal sputtering film formation that depends mainly on electrically neutral sputtering atoms or molecules, or clusters thereof, it realizes sputtering film formation with good coverage by making use of the property of ionized metal ions incident to the wafer surface with a relatively large perpendicular velocity component when a sheath voltage is applied (a bias may be applied additionally). Ionization sputtering has various systems. A PCM system will hereinafter be described specifically, but it is needless to say that the ionization sputtering system in the invention is not limited to it. Accordingly, the system is not limited to "ionization sputtering" insofar as ionized metal atoms for film formation substantially contribute to film formation. In this embodiment, a specific description is made using, as an ionization sputtering apparatus, "1-1080 PCM" (trade name; product of Canon Anelva) employing the PCM system, but an SIP-PVD (self-ionized plasma physical vapor deposition) apparatus of Applied Materials can also be used as an ionization sputtering apparatus. ULVAC Incorporation also provides an analogous apparatus.

Details of Embodiment

Embodiments will be described in further detail. In all the drawings, the same or like members will be identified by the same or like symbols or reference numerals and overlapping descriptions will be omitted in principle.

In the accompanying drawings, hatching or the like is sometimes omitted even from the cross-section when it makes the drawing cumbersome and complicated or when a member can be discriminated clearly from a void. In this context, when apparent from the explanation or the like, a contour of the background is sometimes omitted even if a hole is closed when viewed from the top. Furthermore, hatching may be given to a portion other than a cross-section in order to clearly show that it is not a void.

The detailed description on the formation technology of an aluminum-based metal electrode by using PCM sputtering film formation can be found in Japanese Patent Application No. 2009-092973 (Filed on Apr. 7, 2009 in Japan) so that the description on it is not repeated herein in principle.

1. Explanation about a metal film forming apparatus and the like to be used in the manufacturing method of a semiconductor device according to one embodiment of the present application (mainly, FIGS. 1 and 2)

First, a metal film forming apparatus and the like to be used in the manufacturing method of a semiconductor device according to the one embodiment of the present application will be described briefly. FIG. 1 is a plan view illustrating the configuration of a multi-chamber type (cluster type) wafer processing apparatus to be used in the manufacturing method of a semiconductor device according to the one embodiment of the present application.

As illustrated in FIG. 1, sputtering apparatuses (a PCM ionization sputtering film forming chamber 58 for TiW, an AlSi sputtering chamber 61, and a long throw sputtering film forming chamber 59 for TiW), a heat treatment apparatus (a pre-heat treatment chamber 56), an etching apparatus (a sputter etching chamber 57) to be used in the above-described manufacturing process are integrated in a cluster apparatus 51. This cluster apparatus 51 has a load port 52 (or an anterior chamber) for housing therein four wafer cassettes 53 at normal pressure. A wafer housed in the load port 52 is supplied to each processing chamber after passing through either one of the two load lock chambers 54 and then through a vacuum transfer chamber 55 having an inside converted into vacuum. When the wafer is discharged from the processing chamber, it is discharged in reverse order.

In an example shown in this embodiment, a silicidation annealing step after formation of a TiW film is performed by using a batch processing furnace not in but outside the multi-chamber type wafer processing apparatus 51. This step may be performed without bringing the wafer 1 into contact with the atmosphere in a series of processes by employing a single-wafer type RTA (rapid thermal annealing) chamber as one of a plurality of AlSi sputtering chambers 61.

Figure 2:
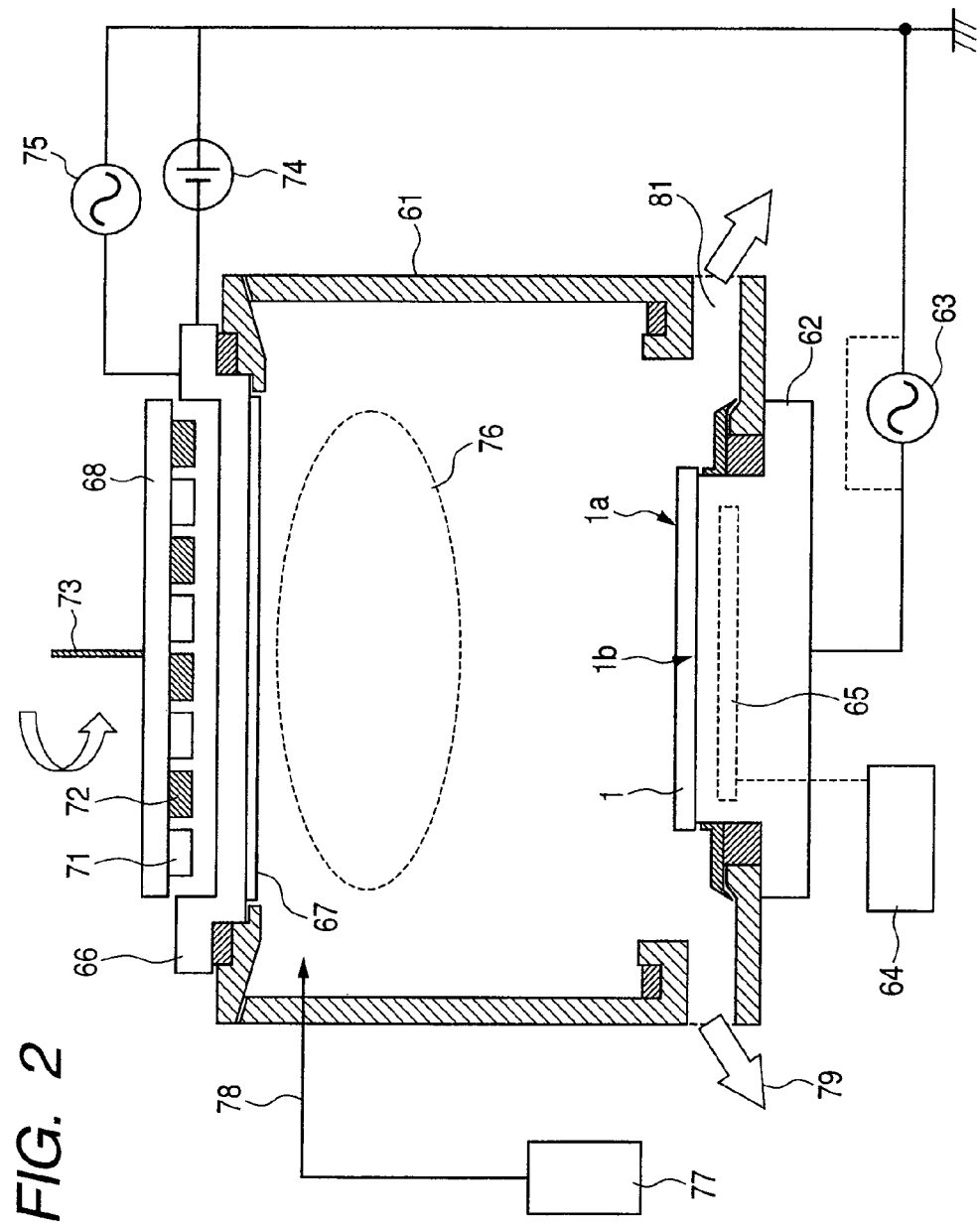
FIG. 2 is a schematic cross-sectional view of a PCM (point cusp magnetron) system sputtering chamber to be used in a step of forming a tungsten-based barrier metal film in the manufacturing method of a semiconductor device according to the one embodiment of the present application.

FIG. 2 is a schematic cross-sectional view of a PCM (point cusp magnetron) system sputtering chamber 58 to be used in a step of forming a tungsten-based barrier metal film in the manufacturing method of a semiconductor device according to the one embodiment of the present application. This sputtering chamber (sputtering apparatus) is, similar to general-purpose metal sputtering apparatuses, embraced in a magnetron sputtering system. As illustrated in FIG. 2, a lower electrode (wafer stage) 62 is placed in the lower portion of the chamber 58 and at the time of film formation, the wafer 1 is set on a wafer stage 62 with a device surface 1a (surface opposite to a back surface 1b) up. To the lower electrode 62, a high frequency bias (second high-frequency power) can be applied from a lower electrode high frequency bias supply 63 (for example, 13.56 MHz). It can also be grounded directly. The wafer stage 62 has therein an electrostatic chuck electrode 65 and it can be turned ON or OFF by using an electrostatic chuck control system 64.

In the upper part of the chamber 58, an upper electrode (target backing plate) 66 is placed opposite to the wafer stage 62 and it has, on the lower surface thereof, a tungsten-based target 67 (as the target, for example, a TiW target containing about 10% of titanium is used). To the upper electrode 66, a DC power (DC bias) and a high frequency power (first high-frequency power) can be applied from an upper electrode DC bias supply 74 and an upper electrode high-frequency supply 75 (for example, 60 MHz) (either or both can be applied). This enables, for example, excitation of an argon plasma 76 or the like and generation of a desired bias voltage (in an ionization sputtering mode, at least this first high frequency power is ON). A magnet holding rotary table 68 in which an S pole 71 and an N pole 72 are arranged alternately is placed in the vicinity of the upper side of the target backing plate 66 and it is rotatable using a drive shaft 73 (rotating shaft).

The chamber 58 has, outside thereof, a gas supply control system 77, by which a gas such as an argon gas can be supplied to the chamber 61 through a gas supply channel 78. In addition, the chamber 58 is vacuum evacuated using a vacuum evacuation system 79 via an exhaust port 81 located in the lower portion of the chamber 58, making it possible to keep high vacuum necessary for sputtering.

2. Explanation about one example of the device structure of a power MOSFET manufactured by the manufacturing method of a semiconductor device according to the one embodiment of the present application (based on mainly FIGS. 3, 6, and 17)

Figure 3:
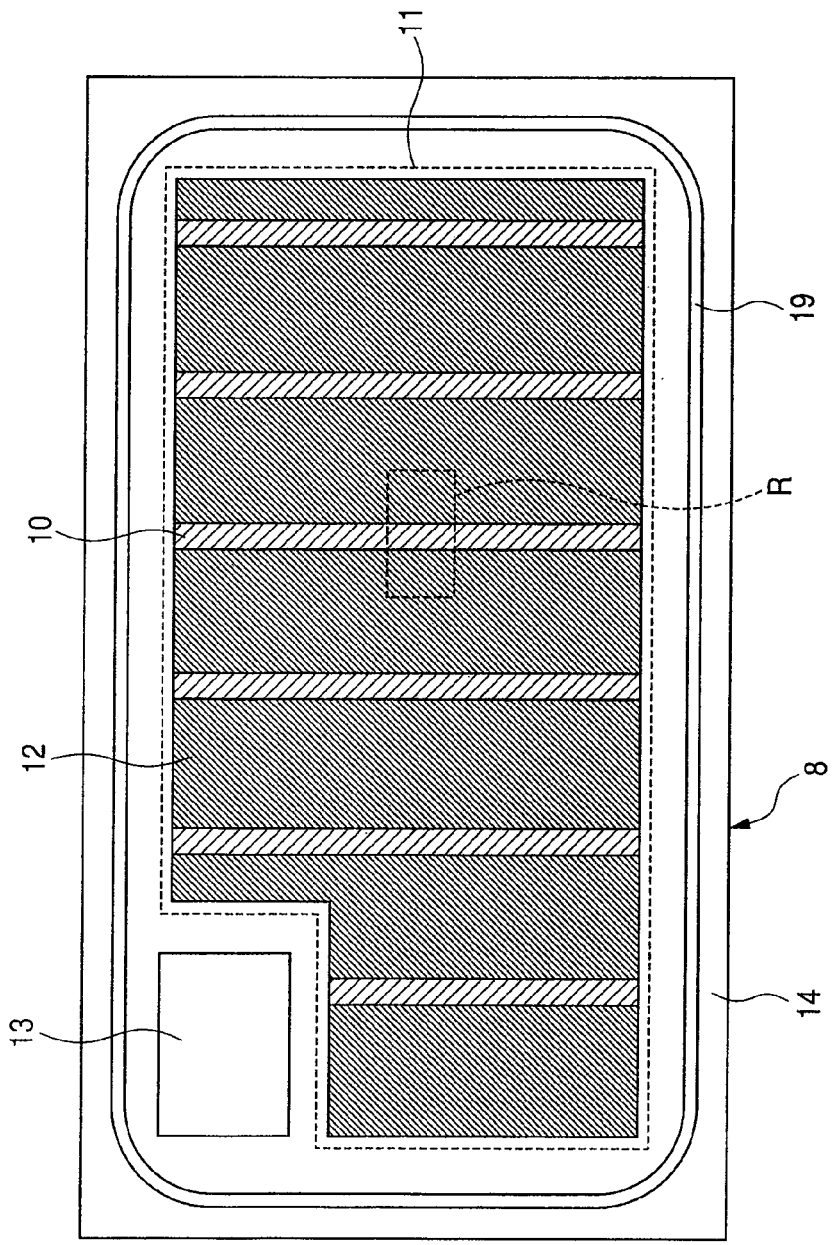
FIG. 3 is a top view of a device illustrating one example of a power MOSFET manufactured by the manufacturing method of a semiconductor device according to the one embodiment of the present application.

FIG. 3 is a top view of a device illustrating one example of a power MOSFET manufactured by the manufacturing method of a semiconductor device according to the one embodiment of the present application. As illustrated in FIG. 3, in a power MOSFET device chip 8 having an element on a square or rectangular plate-like silicon-based semiconductor substrate (which is a wafer before dicing into individual chips), a source pad region 11 (aluminum-based pad) at the center portion occupies a major area of the chip. The chip has therebelow a band-like repeated device pattern region R (linear cell region) in which many band-like gate electrodes and band-like source contact regions have been formed alternately with band-like SBD regions 10 therebetween. More correctly, the linear cell region R extends below almost the entirety of the source pad region 11 and a portion surrounded with a broken line is a part of the linear cell region. This linear cell region R has, at the periphery thereof, a gate pad region 13 for extracting a gate electrode from the periphery to the outside. The linear cell has, at the further periphery thereof, an aluminum guard ring 19. The chip has, at the outermost peripheral portion thereof, a region to be divided by dicing or the like, that is, a scribe region 14.

Figure 14:
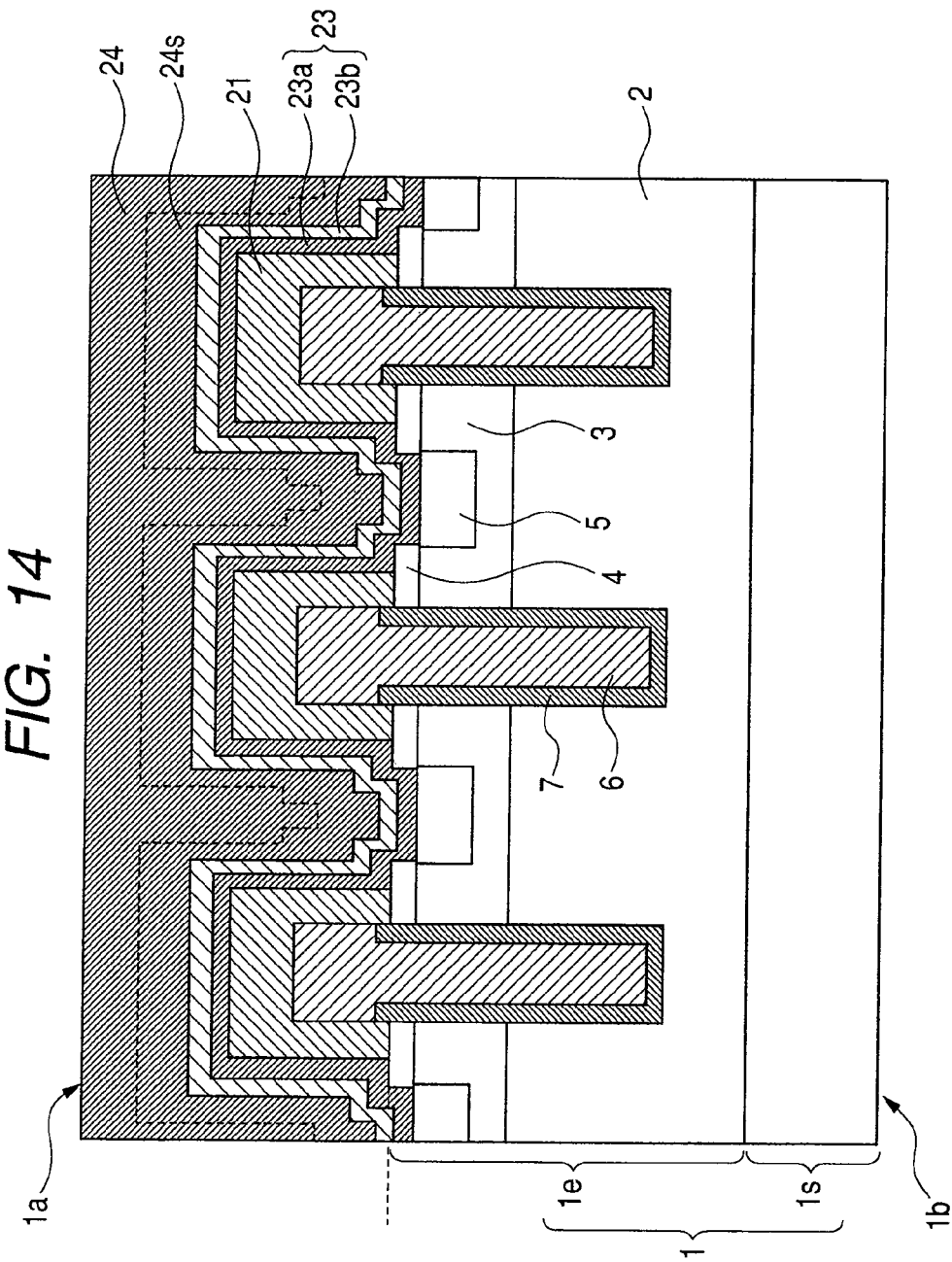
FIG. 14 is a device cross-sectional flow diagram (an aluminum-based metal film formation step) at the trench gate cell portion in the manufacturing method of a semiconductor device according to the one embodiment of the present application.
Figure 16:
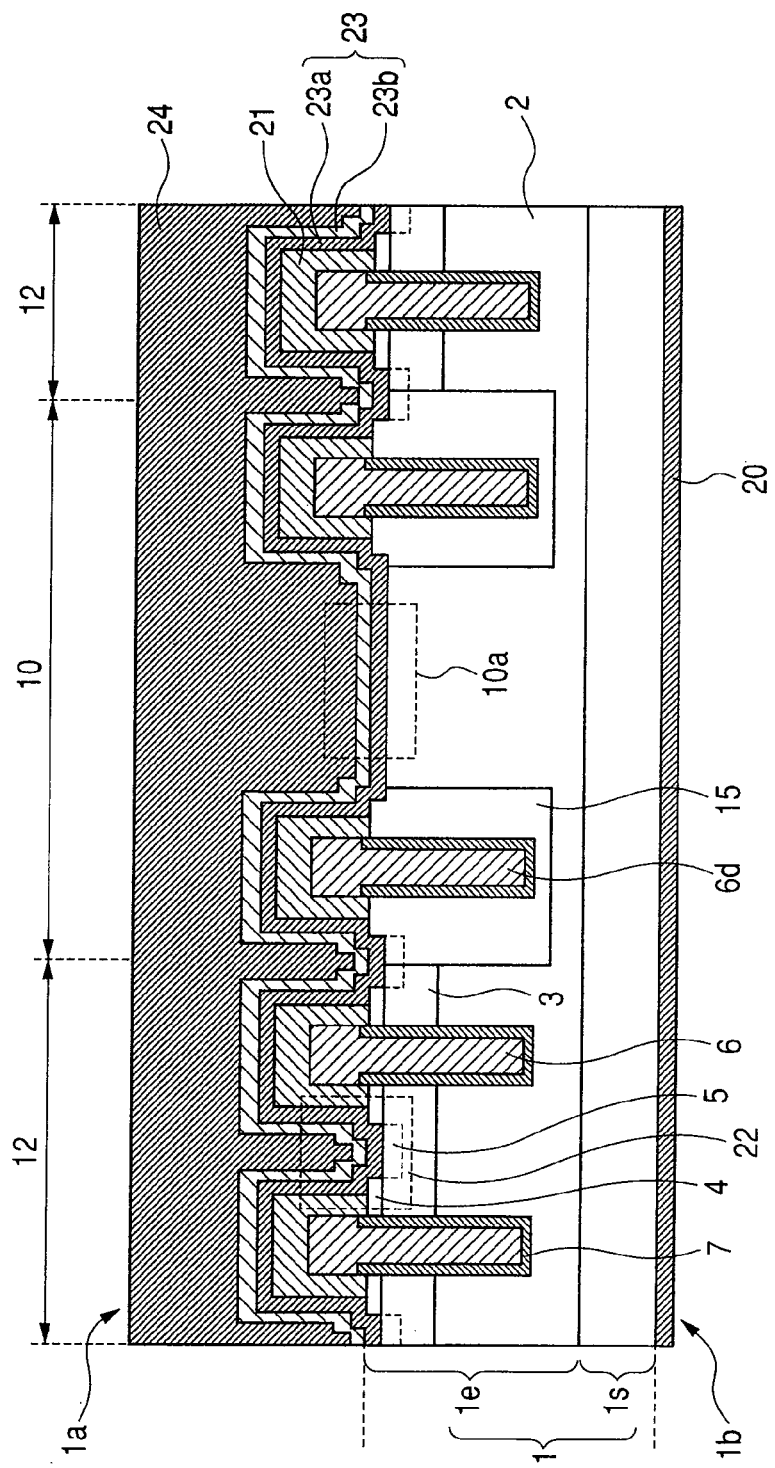
FIG. 16 is an extended cross-sectional structure view of the device corresponding to FIG. 14.
Figure 17:
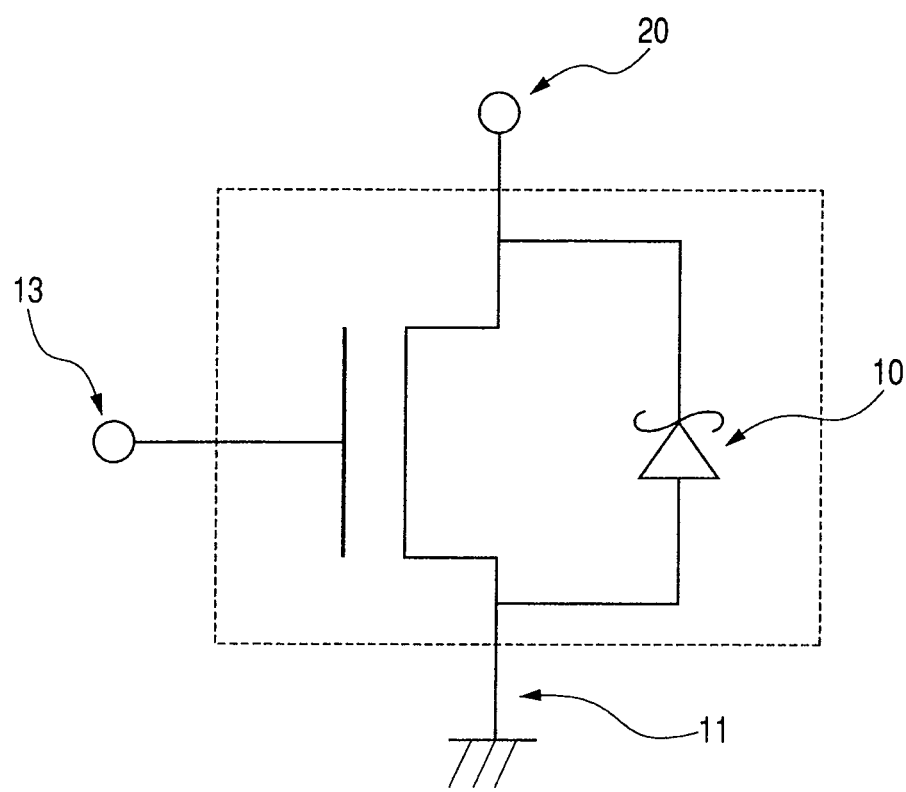
FIG. 17 is an equivalent circuit diagram of the device corresponding to FIG. 16.

FIG. 16 is an extended cross-sectional structure view of the device corresponding to FIG. 14. FIG. 17 is an equivalent circuit diagram of the device corresponding to FIG. 16. Based on them, the cross-section of the device corresponding to the SBD portion and the band-like repeated device pattern region cutout portion R illustrated in FIG. 3 will be outlined.

As illustrated in FIG. 17, the power MOSFET device incorporates therein an SBD as a protection diode for allowing a surge voltage to escape. The cross-section (SBD portion and band-like repeated device pattern region cutout portion R) of the manufacturing step (upon completion of the formation of an aluminum-based source electrode) is as illustrated in FIG. 16. Described specifically, a device is formed over a silicon-based semiconductor single-crystal wafer 1 (surface side 1a and back side 1b). As the wafer 1, for example, that having an n+ silicon substrate portion 1s, an n-epitaxial layer 1e (most of this portion forms an n-type drift region 2), and the like is used. The n+ silicon substrate portion 1s has, on the back side thereof, a back-side metal layer serving as a drain electrode 20.

As illustrated in FIG. 16, the SBD region 10 lies at the center portion and it has a cell region 12 of MOSFET on both sides thereof. In an SBD main portion 10a of the SBD region 10, an n-epitaxial layer 1e and a lower-layer barrier metal film (first layer film) 23a face each other with a thin titanium silicide film (not illustrated) therebetween and form a Schottky junction. On both sides of the n-epitaxial layer 1e below the SBD main portion 10a, relatively deep p-well regions 15 are provided and it configures an element isolation region together with dummy trench gate electrodes 6d.

On the other hand, the n-epitaxial layer 1e of the cell region 12 of MOSFET has, in the upper portion thereof, a p-base region 3 and a trench gate electrode (polysilicon electrode) 6 penetrating through this p-base region 3 and reaching the inside of the n-epitaxial layer 1e. This trench gate electrode 6 is isolated from a semiconductor region therearound via a gate insulating film 7. In the surface region of the p-base regions 3 on both sides of the trench gate electrode 6, n+ source regions 4 are provided. A p+ body contact region 5 is provided in the surface of the semiconductor region between the n+ source regions 4 adjacent to each other. The top portion of the trench gate electrode 6 is covered with a relatively thick interlayer insulating film 21 and a recess (source contact trench) 22 having a two-stage structure is formed between the interlayer insulating films 21 adjacent to each other. Such a structure has the merit of increasing the area of a contact portion and thereby improving the contact characteristics. On the other hand, the recess (source contact trench) 22 having a two-stage structure has the demerit of complicating the structure at the boundary between the bottom stage (recess bottom lower-stage 26) and the upper stage (recess bottom upper-stage 25) (refer to FIG. 11). Accordingly, it is also possible to form a structure having a flat bottom in order to avoid such a demerit.

A lower-layer barrier metal film (first layer film) 23a and an upper-layer barrier metal film (second layer film) 23b are formed so as to cover the surface on the surface side of the semiconductor substrate 1 and the interlayer insulating film 21. A thick aluminum-based metal film (source electrode) 24 is formed over the upper-layer barrier metal film.

3. Explanation about the outline of a device cross-sectional flow diagram relating to the manufacturing method of a semiconductor device according to the one embodiment of the present application (based on mainly FIGS. 4 to 14)

With a 0.15-μm process linear trench gate power MOSFET as an example, the process flow will next be described using the cross-section of the device corresponding to the trench gate cell portion 12 of the band-like repeated device pattern region cutout portion R explained in Section 2 based on FIG. 3.

Figure 4:
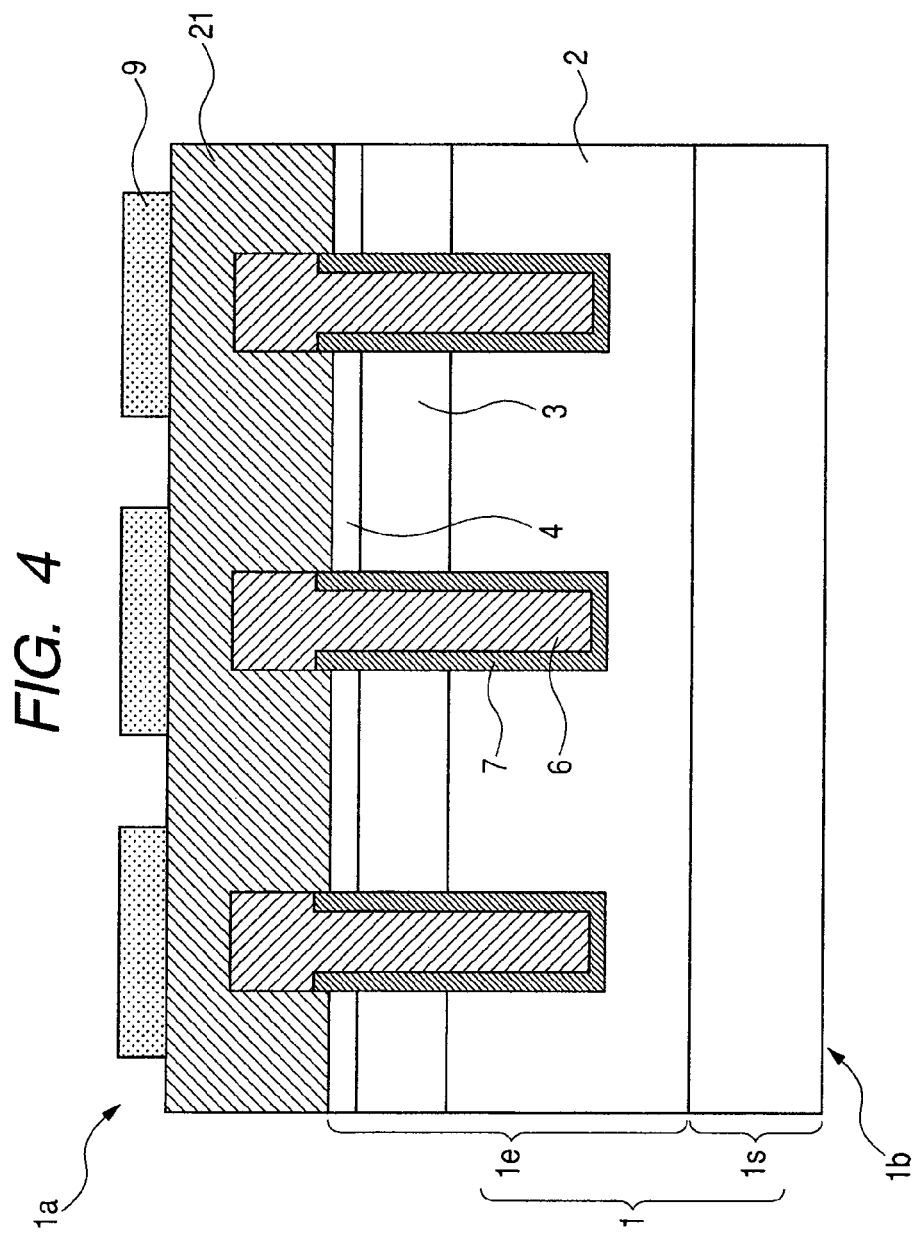
FIG. 4 is a device cross-sectional flow diagram (a step of forming a resist pattern for the formation of a source contact trench) at a trench gate cell portion in the manufacturing method of a semiconductor device according to the one embodiment of the present application.

FIG. 4 is a device cross-sectional flow diagram (a step of forming a resist pattern for the formation of a source contact trench) at the trench gate cell portion in the manufacturing method of a semiconductor device according to the one embodiment of the present application. In this section, explained is an example of using, as a raw material wafer, an n-epitaxial wafer 1 obtained by forming an n-epitaxial layer (for example, having a thickness of about 4 μm) on a 200Ø n+ type silicon single crystal wafer (silicon-based wafer). The diameter of the wafer is not limited and it may be 300Ø or 450Ø. A wafer having a conductivity type of p can also be used. Further, the wafer is not limited to an epitaxial wafer but may be another semiconductor substrate, an insulating substrate or the like. If necessary, the wafer may be a semiconductor wafer or a substrate, each comprised of a material other than silicon.

As illustrated in FIG. 4, the semiconductor wafer 1 is comprised mainly of an n+ silicon substrate portion 1s and an epitaxial layer 1e. The epitaxial layer 1e has therein an n-drift region 2 which is originally an n-epitaxial layer and has thereover a p-channel region (p-base region) 3, an n+ source region 4, and the like. A plurality of trench gate electrodes (polysilicon electrodes) 6 are provided at certain intervals in such a manner that the upper portion thereof protrudes from the epitaxial layer 1e. Each of the trench gate electrodes 6 has, around the middle and lower portions thereof, a gate insulating film 7. The semiconductor wafer 1 has, on the device surface side 1a thereof, an interlayer insulating film 21 and it completely covers therewith each of the trench gate electrodes 6. Examples of this interlayer insulating film 21 include a multilayer insulating film comprised of, in the order starting from the lower layer, a silicon nitride film (silicon nitride-based insulating film) having a thickness of about 60 nm, a PSG film (silicon oxide-based insulating film) having a thickness of about 300 nm, and an SOG film (silicon oxide-based insulating film) having a thickness of about 95 nm.

Figure 5:
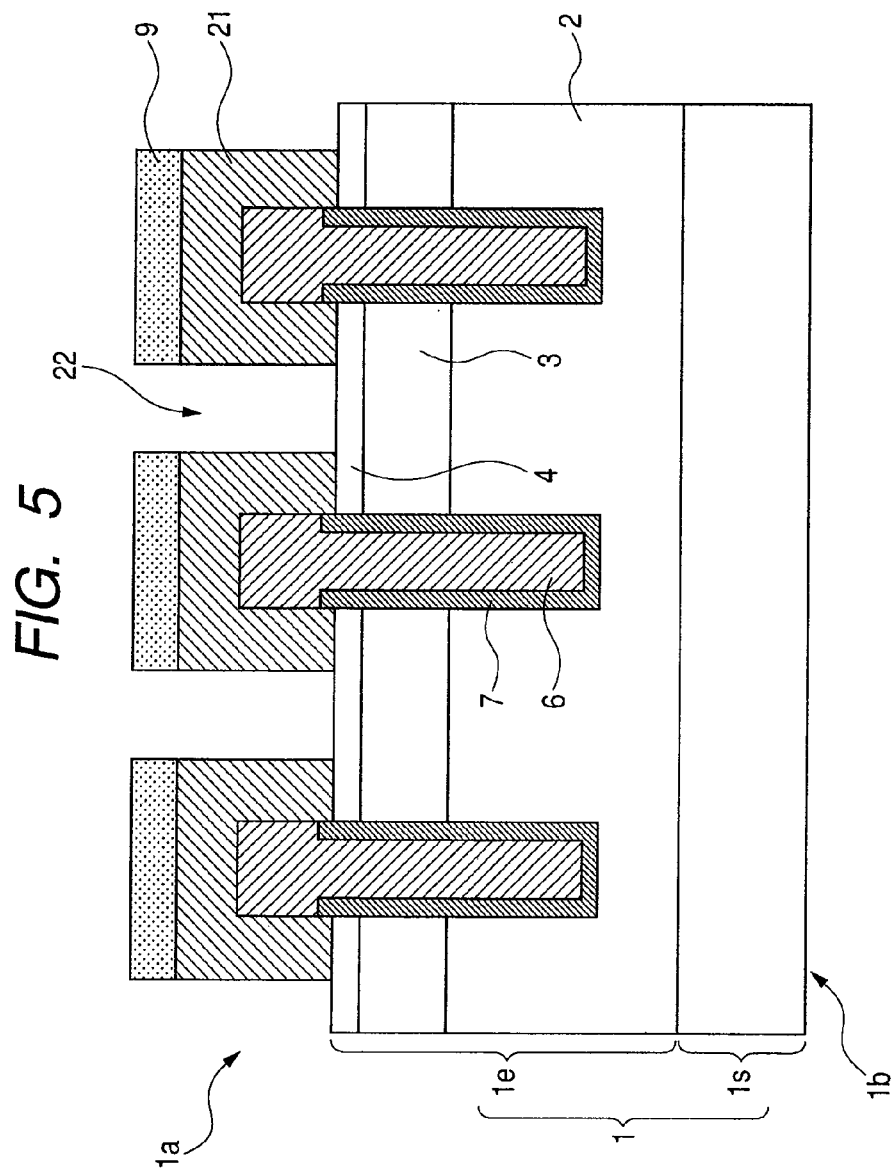
FIG. 5 is a device cross-sectional flow diagram (a source/contact trench formation step) at the trench gate cell portion in the manufacturing method of a semiconductor device according to the one embodiment of the present application.
Figure 6:
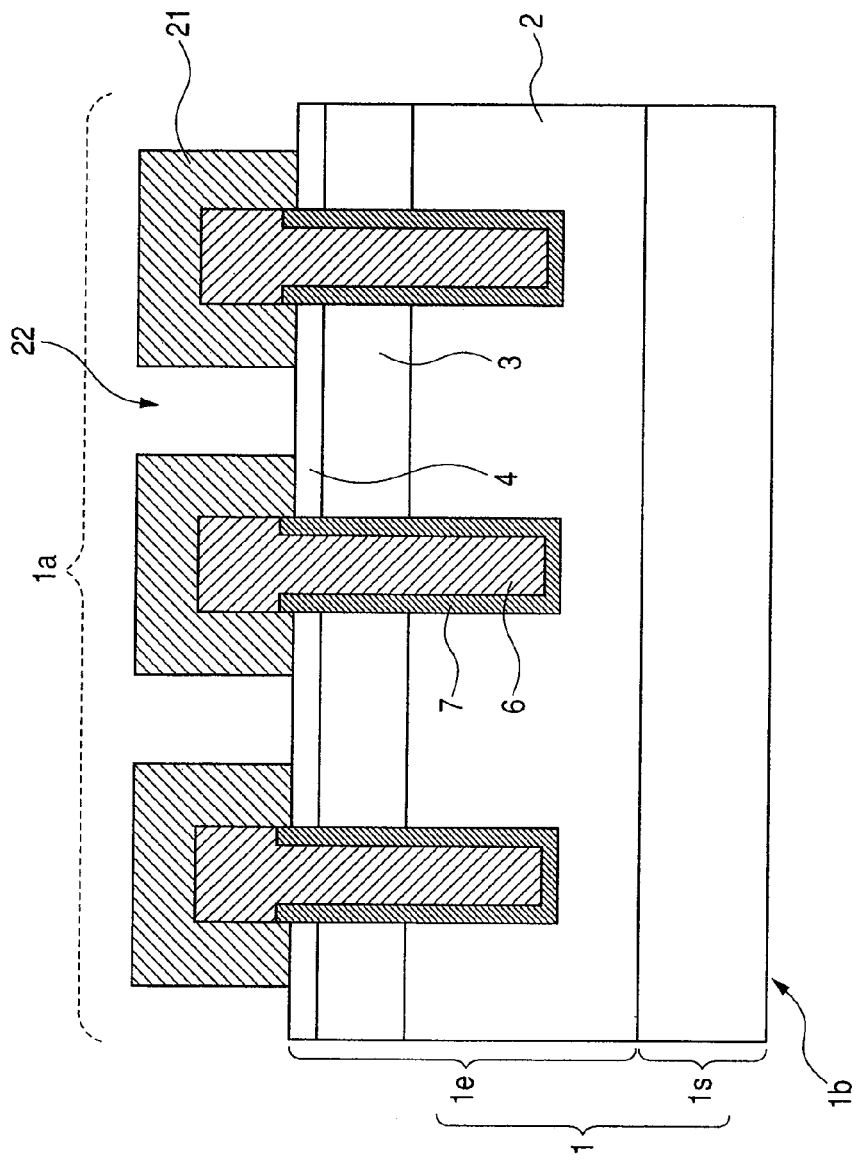
FIG. 6 is a device cross-sectional flow diagram (a resist pattern removal step for forming the source/contact trench) at the trench gate cell portion in the manufacturing method of a semiconductor device according to the one embodiment of the present application.

The interlayer insulating film 21 has thereover a resist film 9 for processing. When dry etching is performed with this resist film 9 as an etching mask, a recess (source contact trench) 22 is formed as illustrated in FIG. 5. The state after removal of the resist film 8 which becomes unnecessary is illustrated in FIG. 6.

Figure 7:
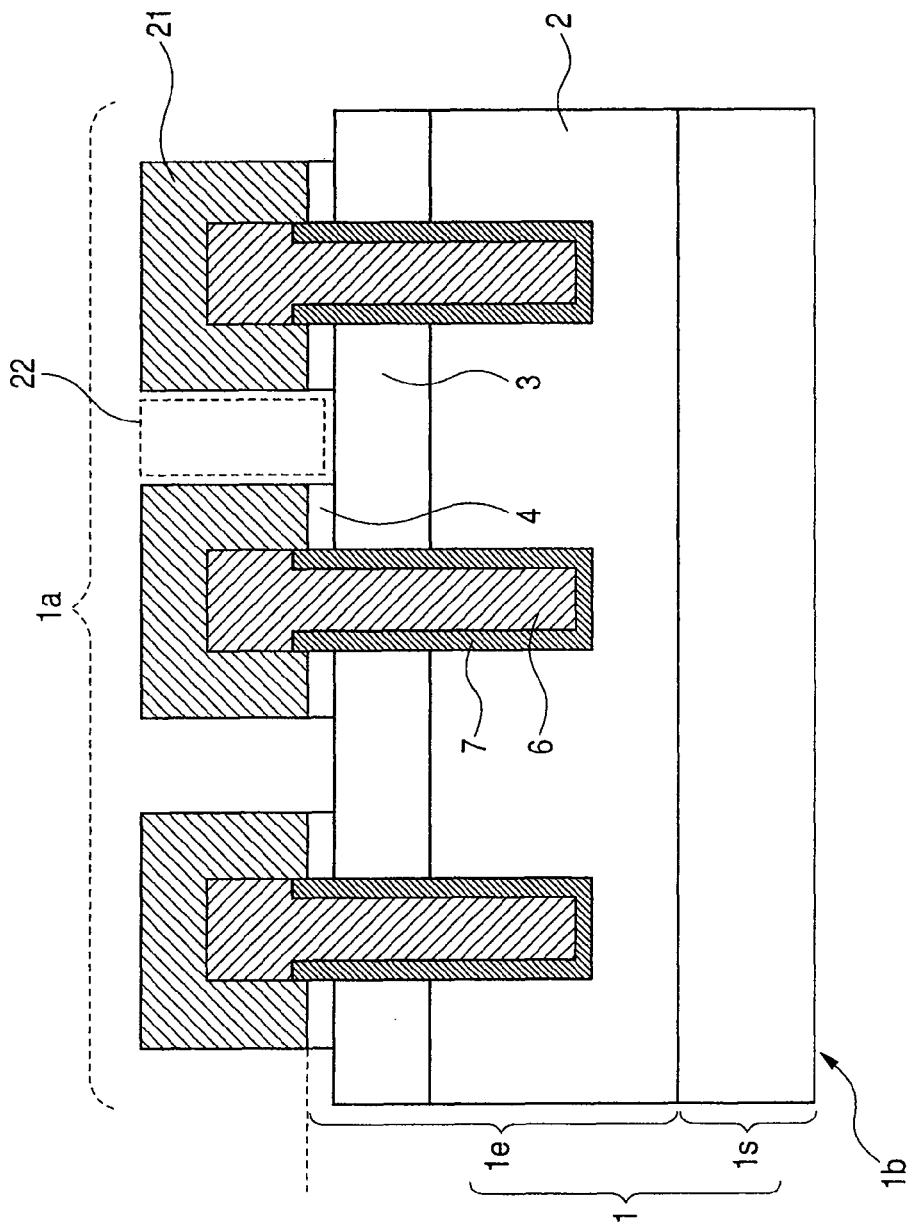
FIG. 7 is a device cross-sectional flow diagram (a source/contact trench extending step) at the trench gate cell portion in the manufacturing method of a semiconductor device according to the one embodiment of the present application.

When dry etching is then performed further with the patterned interlayer insulating film 21 as an etching mask, the recess (source contact trench) 22 is extended to the upper end of the p-channel region 3 as illustrated in FIG. 7.

Figure 8:
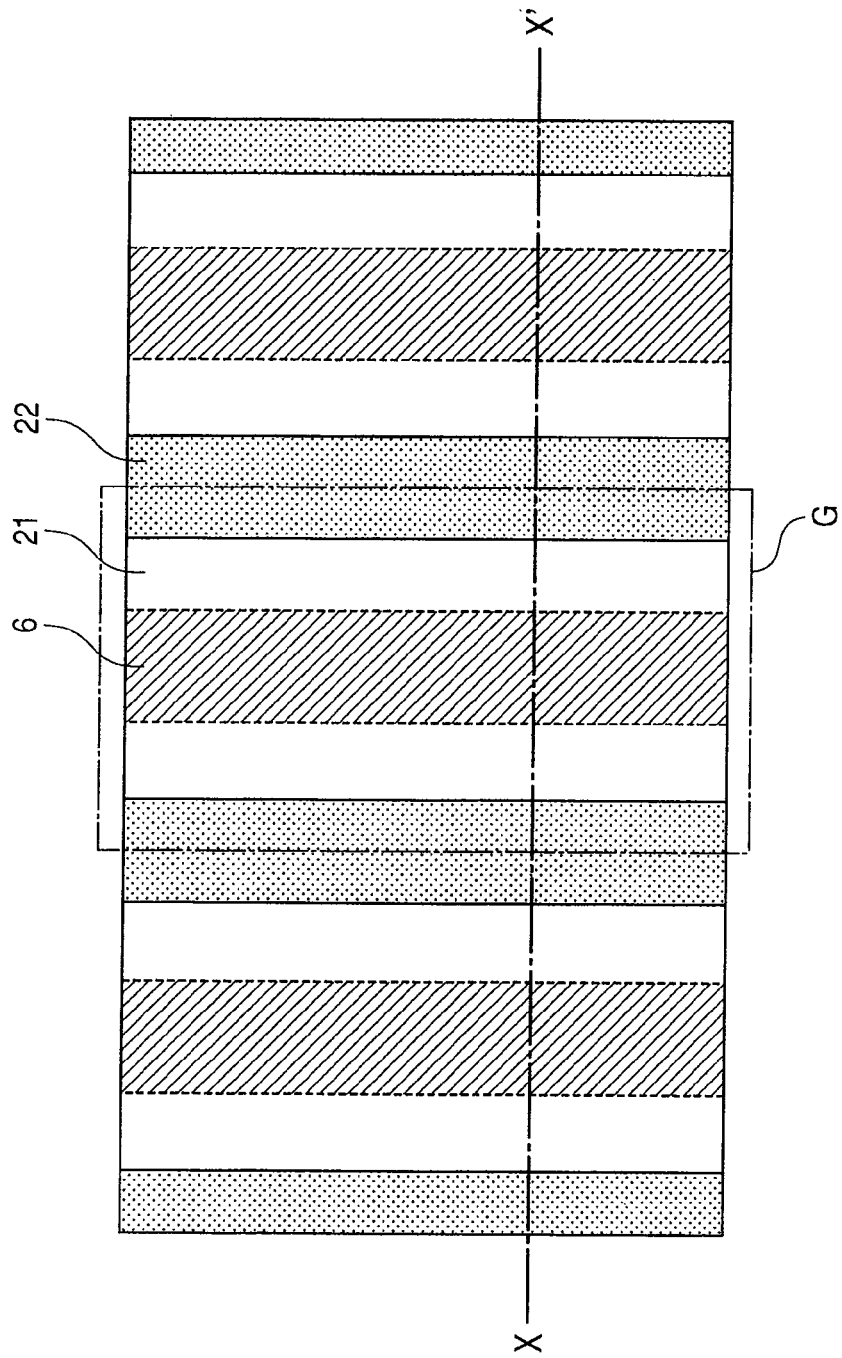
FIG. 8 is a device top view (a p+ body/contact region introducing step) at the trench gate cell portion in the manufacturing method of a semiconductor device according to the one embodiment of the present application.
Figure 9:
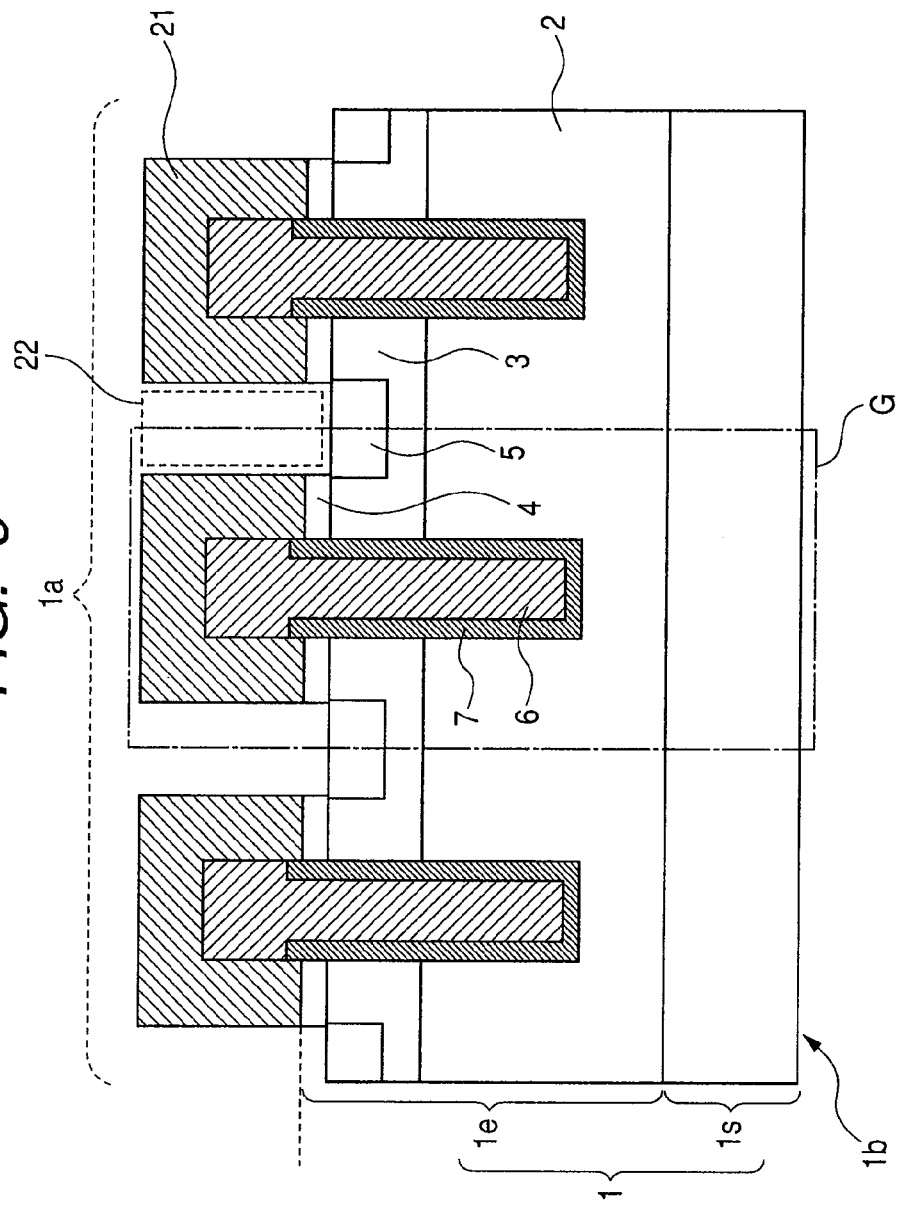
FIG. 9 is a device cross-sectional flow diagram (the p+ body/contact region introducing step) at the trench gate cell portion (corresponding to the X-X' cross-section of FIG. 8) in the manufacturing method of a semiconductor device according to the one embodiment of the present application.

FIG. 8 is the upper surface of the device (upper surface of the wafer) corresponding to FIG. 7 (corresponding also to FIG. 9) at this time. FIG. 9 also illustrates a region corresponding to the cell repeating unit region G in FIG. 8.

Following FIG. 7, a p+ body contact region 5 is introduced into the surface region of the p-channel region 3 by ion implantation through the source contact trench 22 (having, for example, a bottom width of about 300 nm, a depth of about 850 nm, and an aspect ratio of 2 or greater but not greater than 5 and about 2.8 on average).

Figure 10:
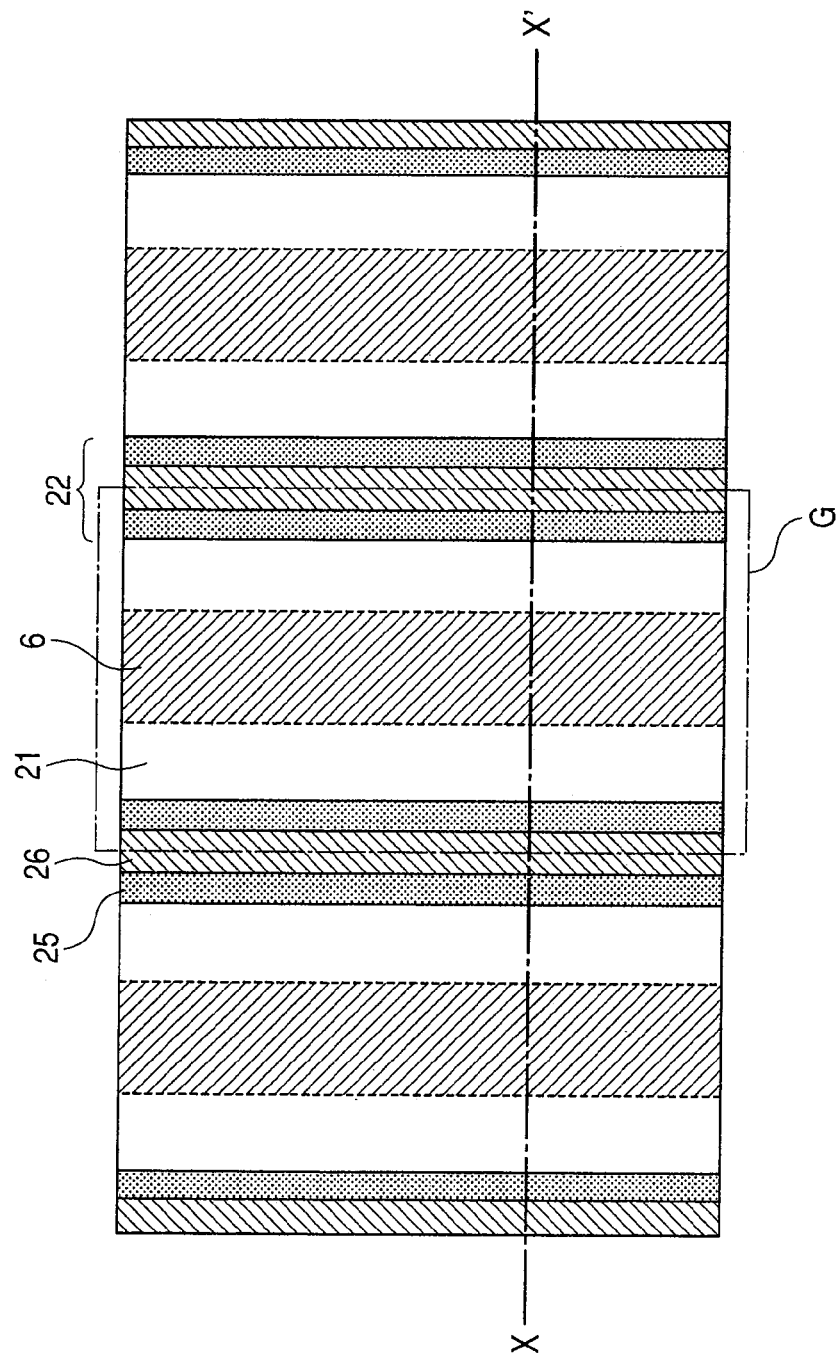
FIG. 10 is a device top view (a formation step of a two-stage structure of a contact trench) at the trench gate cell portion in the manufacturing method of a semiconductor device according to the one embodiment of the present application.
Figure 11:
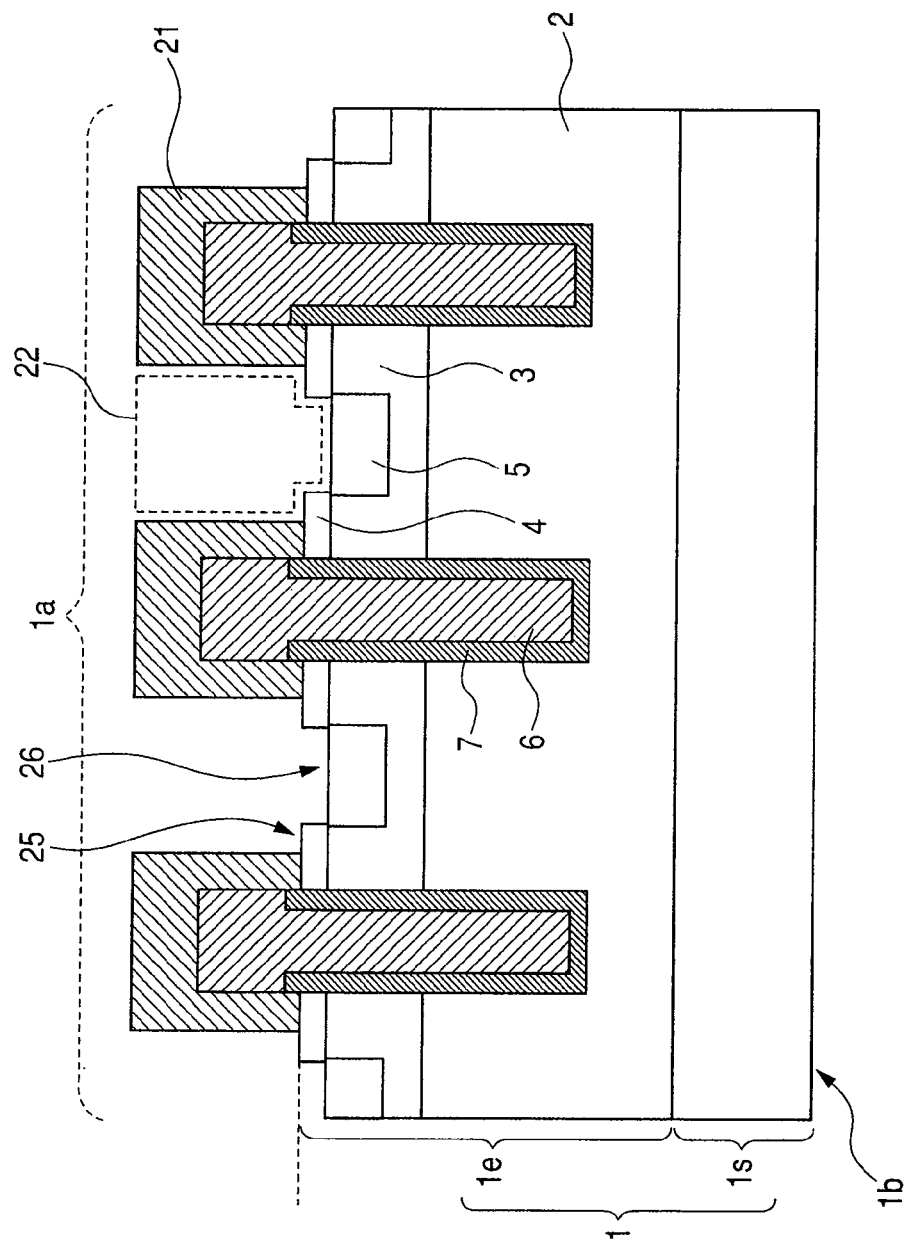
FIG. 11 is a device cross-sectional flow diagram (the formation step of a two-stage structure of a contact trench) at the trench gate cell portion (corresponding to the X-X' cross-section of FIG. 10) in the manufacturing method of a semiconductor device according to the one embodiment of the present application.

Then, as illustrated in FIG. 11, the surface side 1a of the wafer 1 is subjected to isotropic oxide-film etching to reduce the width of the interlayer insulating film 21, resulting in completion of the formation of a recess (source contact trench) 22 having a two-stage structure comprised of a recess bottom upper-stage 25 and a recess bottom lower-stage 26. The upper surface of the device (upper surface of the wafer) corresponding to FIG. 11 at this time is shown in FIG. 10.

Figure 12:
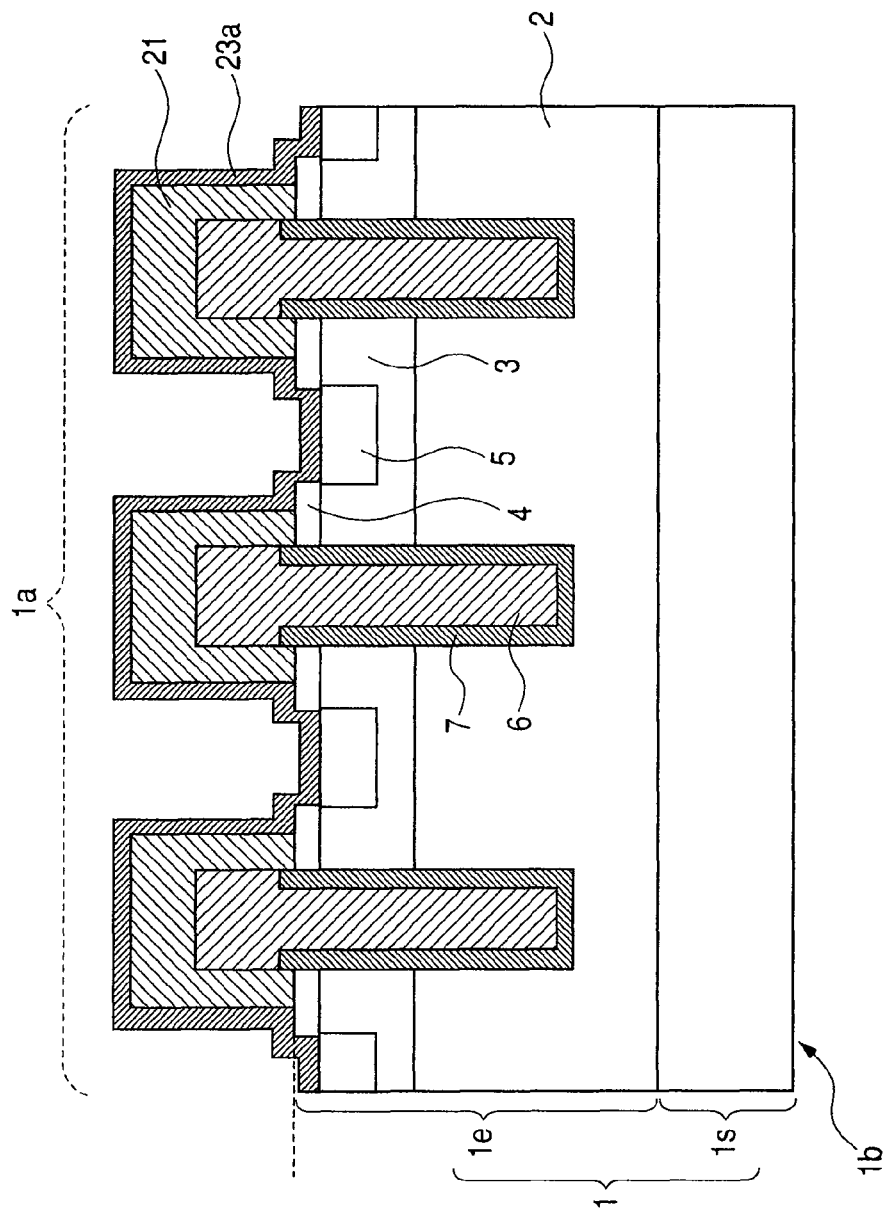
FIG. 12 is a device cross-sectional flow diagram (a step of forming a lower-layer barrier metal film) at the trench gate cell portion in the manufacturing method of a semiconductor device according to the one embodiment of the present application.

After the device as illustrated in FIG. 11 is obtained, a TiW film is formed as a lower-layer barrier metal film 23a over almost the whole surface of the semiconductor wafer 1 on the device surface side 1a as illustrated in FIG. 12 by PCM sputtering film formation (ionization sputtering film formation) while applying a bias to the wafer side.

The sputtering film formation of the TiW film 23a is performed, for example, in the following procedure. Described specifically, the wafer 1 is housed in the wafer transport container (wafer cassette) 53 illustrated in FIG. 1 and the cassette is set in the load port 52 of the multi-chamber type wafer processing apparatus 51. First, the wafer 1 is set on a wafer stage in a degassing chamber 56 and is subjected to preheat treatment for removing moisture or the like from the surface. The preheat treatment is performed, for example, under the following conditions: a stage temperature set at about 375° C., pressure at about 266 Pascal, an argon flow rate at about 200 sccm, and treatment time for about 50 sec.

The wafer 1 is then set on a wafer stage of the sputter etching chamber 57 illustrated in FIG. 1 and is subjected to sputter etching for removing the oxide film from the surface. The sputter etching is performed, for example, under the following conditions: an uncontrolled stage temperature, a pressure at about 0.5 Pascal, and an argon flow rate at about 37.5 sccm. Plasma excitation is performed using, for example, a CCP (capacitively coupled plasma) system under the following conditions: a high-frequency power at 400 W (for example, 60 MHz), etching time for about 25 seconds, and an etching amount of about 10 nm.

The resulting wafer 1 is then set on a wafer stage of the PCM ionization sputtering film forming chamber 58 for TiW illustrated in FIGS. 1 and 2 and lower-layer TiW sputtering film formation treatment is performed, for example, in accordance with the PCM sputtering system. The film is formed, for example, under the following conditions: film thickness of about 125 nm, treatment time for about 50 sec, degree of vacuum at about 18 Pascal, an argon flow rate at about 175 sccm, stage temperature at room temperature (wafer is, for example, gas cooled with an electrostatic chuck ON), target-side high frequency power at about 4 kW (for example, 60 MHz), wafer-side high-frequency power at about 400 W (for example, 13.56 MHz), target-side DC bias voltage OFF (when the film formation rate is insufficient, application of the voltage increases the film formation rate), and a target composition having 10% titanium and 90% tungsten (each, wt. %). This step may be performed by not only the PCM system but also another ionization sputtering system.

Figure 13:
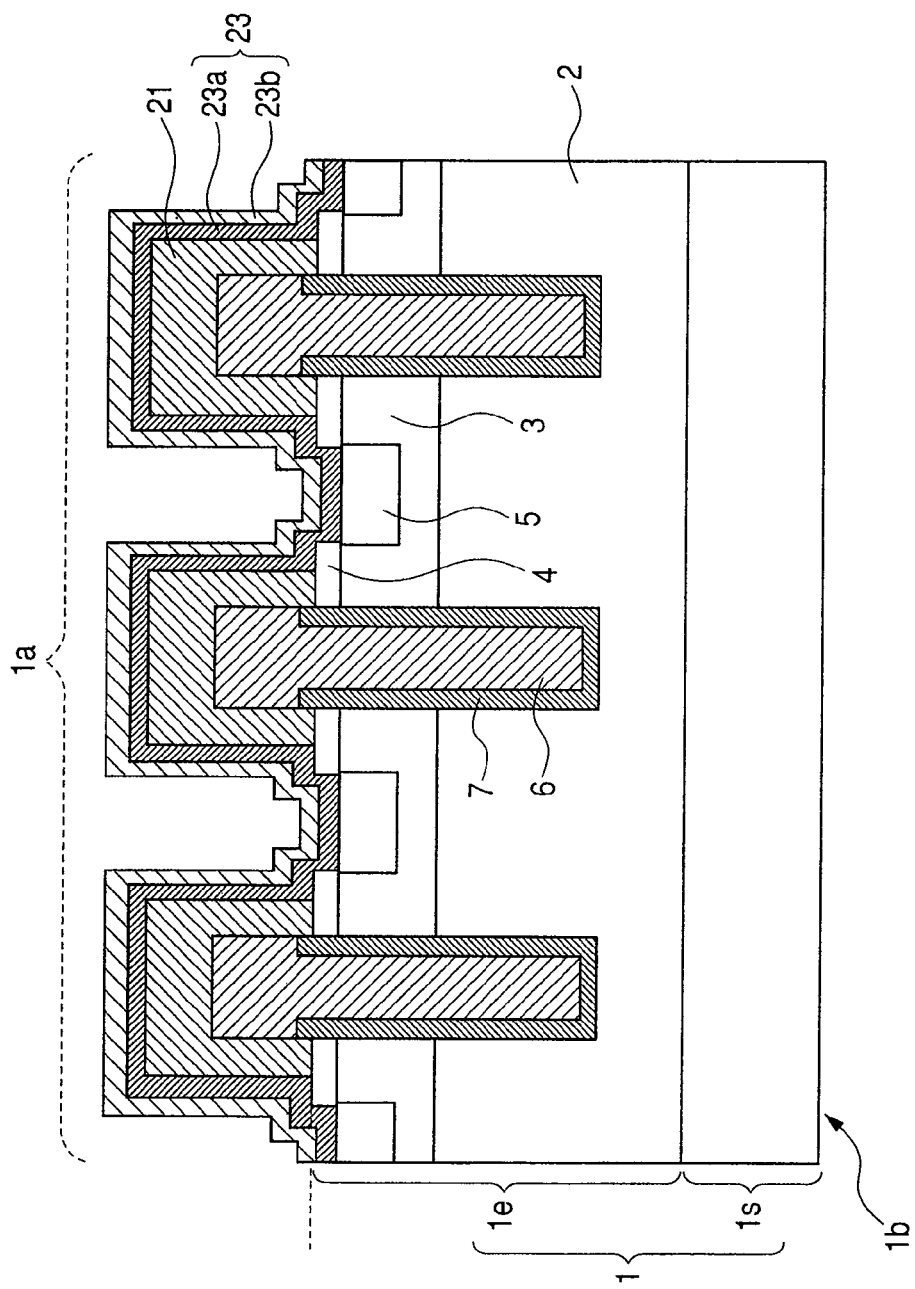
FIG. 13 is a device cross-sectional flow diagram (the step of forming an upper-layer barrier metal film) at the trench gate cell portion in the manufacturing method of a semiconductor device according to the one embodiment of the present application.

Then, as illustrated in FIG. 13, an upper-layer barrier metal film 23b (TiW film) is formed over almost the whole surface of the TiW film 23a by PCM sputtering film formation without substantially applying a bias to the wafer side. This PCM sputtering film formation (ionization sputtering film formation) of the titanium nitride film 23b without substantially applying a bias to the wafer side is performed, for example, in the following procedure. Described specifically, the lower electrode 62 is grounded directly in the PCM ionization sputtering film forming chamber 58 for TiW (FIG. 2) illustrated in FIG. 1 and the wafer 1 is subjected to PCM sputtering film formation treatment to form the TiW film 23b. The film is formed, for example, under the following conditions: film thickness of about 125 nm, treatment time for about 50 seconds, degree of vacuum at about 18 Pascal, an argon flow rate at about 175 sccm, a stage temperature at room temperature (the wafer is gas cooled with an electrostatic chuck ON), a target-side high-frequency power at about 4 kW, a wafer-side high-frequency power OFF, a target-side DC bias voltage OFF (when the film formation rate is insufficient, application of the voltage increases the rate), and a target composition having 10% titanium and 90% tungsten (wt. %). This step can be performed by not only the PCM system but also another ionization sputtering system. This step can also be performed by using a sputtering film forming chamber not employing a typical ionization sputtering system such as LT (long throw) sputtering film forming chamber 59 for TiW illustrated in FIG. 1, depending on the shape of the recess (source contact trench) 22 (for example, when a requirement for the filling property is relatively loose).

When silicidation annealing is then performed, the surface of a silicon member contiguous to the portion of the TiW film 23a in FIG. 13 becomes a thin titanium silicide film with titanium supplied from the lower surface and inside of the TiW film 23a. Since illustration of such a change makes the view more complicated, it is omitted from FIGS. 13 to 16.

The silicidation annealing is performed, for example, in the following procedure. Described specifically, the wafer 1 is transferred outside of the multi-chamber type wafer processing apparatus illustrated in FIG. 1. It is housed in the wafer cassette 53, transferred to, for example, a batch system annealing apparatus, and subjected to silicidation annealing. The silicidation annealing is performed, for example, under the following conditions: a temperature at about 650° C., an atmospheric pressure, for example, at normal pressure, a nitrogen gas flow rate of about 15 liter/min, and annealing time for about 10 seconds. This step can also be performed in the multi-chamber type wafer processing apparatus 51 or by using a single-wafer type RTA apparatus placed in another place.

After completion of the silicidation annealing, a seed aluminum-based metal film 24s is formed over almost the whole surface of the TiW film 23b as illustrated in FIG. 14, for example, by PCM sputtering film formation (in, for example, the aluminum-based metal film sputtering chamber 61 illustrated in FIG. 1 made similar to the PCM ionization sputtering film forming chamber 58 for TiW illustrated in FIG. 2). The seed aluminum-based metal film 24s and the main aluminum-based metal film 24 can also be formed by using another ionization sputtering film formation apparatus. When the requirement for the filling property is not severe, a typical non-ionization sputtering film formation apparatus similar to the LT sputtering film forming chamber 59 (FIG. 1) can also be used.

The sputtering film formation of the seed aluminum-based metal film 24s is performed, for example, in the following procedure. Described specifically, the wafer 1 is discharged from the batch-type annealing apparatus, housed in the wafer transfer container (wafer cassette) 53 illustrated in FIG. 1, and set in the load port 52 of the multi-chamber type wafer processing apparatus 51. The wafer 1 is set again on the wafer stage in the degassing chamber 56 and preheated for removing moisture or the like from the surface. Preheating is performed, for example, under the following conditions: a stage temperature set at about 375° C., a pressure at about 266 Pascal, an argon flow rate at about 200 sccm, and pre-heating time for about 50 sec.

The wafer 1 is then set on the wafer stage 62 in the aluminum-based metal film sputtering chamber 61 illustrated in FIGS. 1 and 2 and the seed aluminum-based metal film 24s is formed by sputtering. Formation of the seed aluminum-based metal film is performed, for example, under the following conditions: a stage temperature set at about 420° C. (with the electrostatic chuck OFF), a pressure at about 5 Pascal, an argon flow rate at about 20 sccm, an upper electrode high-frequency power at 4 kW (for example, 60 MHz), an upper electrode DC power at 1 kW, a lower electrode high-frequency power at 200 W (for example, 13.56 MHz), a sputtering time for about 3 minutes, and a film formation amount of about 600 nm. The preset temperature of the stage is preferably from about 400° C. to 440° C. Since the electrostatic chuck is OFF, it is possible to prevent closure of the upper portion of the source contact trench 22 which will otherwise occur as a result of an excessive rise in the wafer temperature and an excessive progress of reflow of the deposited aluminum-based metal member at the time of forming the seed aluminum-based metal film. This means that in the former half period of the formation of a film using the aluminum-based metal member, formation of an adequately thick aluminum-based metal member film on the bottom surface portion of the source contact trench 22 greatly contributes to the final filling property rather than flattening by reflow. Accordingly, application of the bias to the lower electrode is particularly effective in the former half period because it enables pushing of metal ions onto the wafer more perpendicularly.

As illustrated in FIG. 14, an aluminum-based metal film 24 is formed over almost the whole surface of the seed aluminum-based metal film 24s by PCM sputtering film formation (in, for example, the aluminum-based metal film sputtering chamber 61 illustrated in FIG. 1 made similar to the PCM ionization sputtering film forming chamber 58 for TiW illustrated in FIG. 2)) to, together with the seed aluminum-based metal film 24s, fill the inside of the recess (source contact trench) 22 and further to cover the upper portion of the titanium nitride film 23b outside the recess (source contact trench) 22.

The latter sputtering (latter half of the sputter film formation) for forming the aluminum-based metal film 24 is performed, for example, in the following procedure. Described specifically, the former sputtering conditions are changed continuously to the latter sputtering conditions without moving the wafer 1 from the wafer stage 62 in the film forming chamber 61 upon formation of the seed aluminum-based metal film 24s (under almost similar conditions). The latter sputtering film formation for forming the aluminum-based metal film 24 is performed under the following conditions: a stage temperature set at about 420° C. (with an electrostatic chuck ON), a pressure at about 5 Pascal, an argon flow rate at about 20 sccm, an upper electrode high-frequency power of 4 kW (for example, 60 MHz), an upper electrode DC power of 1 kW, a lower electrode high-frequency power OFF, a sputtering time for about 3 minutes, and a film formation amount of about 600 nm. The stage temperature is set preferably in a range of from about 400° C. to 440° C.

When the stage temperature upon sputtering film formation (in the former half and the latter half) is set at less than 400° C., reflow does not proceed adequately, while when the stage temperature exceeds 440° C., an aggregation phenomenon of an undesired metal is likely to occur. In the sputtering formation (in the latter half), when the lower electrode high-frequency power is made ON, a similar aggregation phenomenon tends to occur due to an undesired rise in the wafer temperature. As the source electrode material, AlCu, pure Al, copper-based metal member and the like as well as silicon-added aluminum-based metal (AlSi) are usable.

Then, the aluminum-based metal film 24 is patterned. A final passivation insulating film (for example, an organic insulating film such as a polyimide resin film obtained by the method of application and having a thickness of about 2 μm) is then formed over the patterned film, followed by formation of necessary openings. The resulting wafer is diced into individual chips to obtain a device as illustrated in FIG. 3.

4. Explanation about the barrier metal structure of a device manufactured using a manufacturing method of a semiconductor device according to another embodiment of the present application (mainly FIG. 15)

The structure explained herein is a device structure obtained according to a modification example of the two-stage barrier metal film formation process explained referring to FIGS. 12 and 13.

Figure 15:
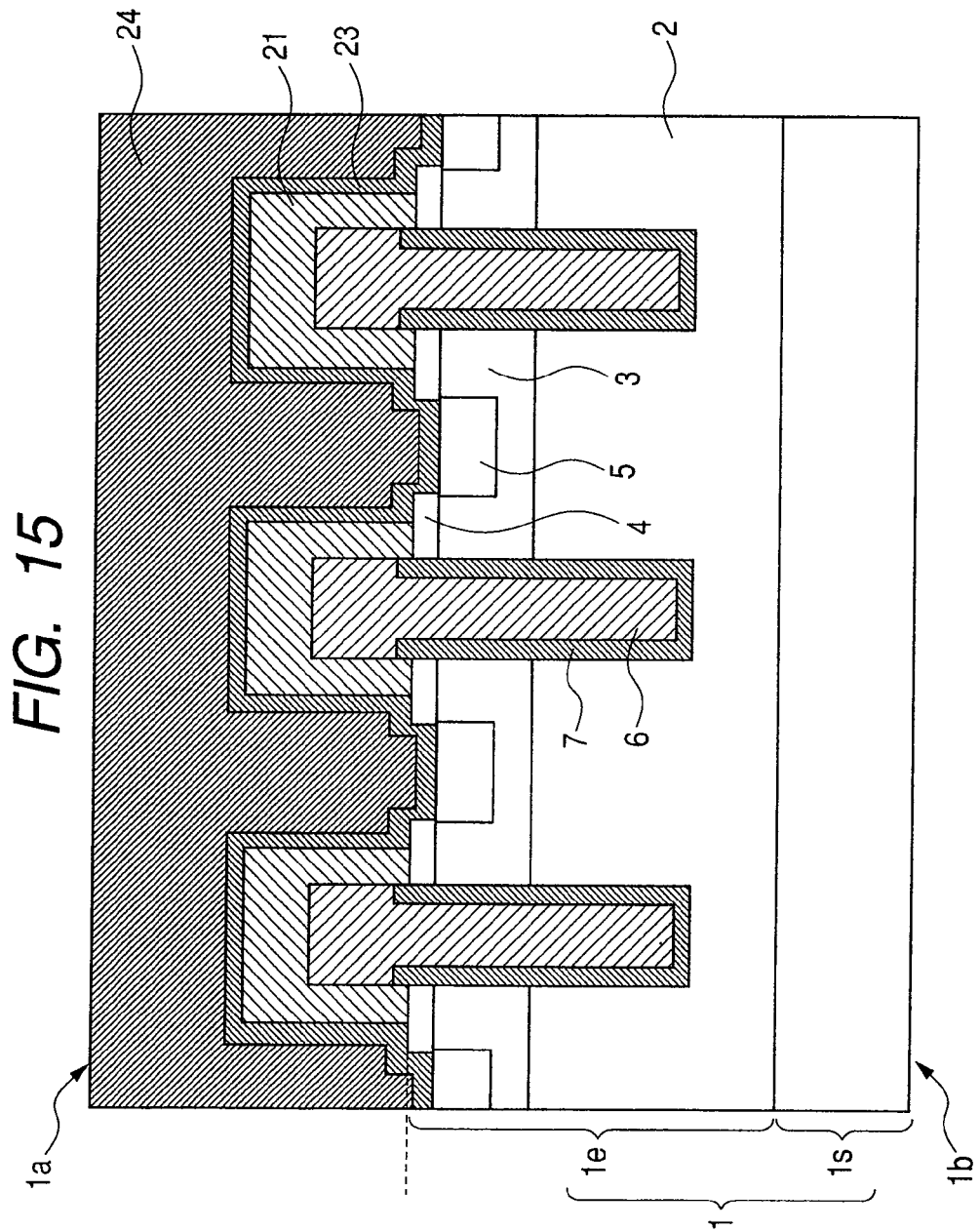
FIG. 15 is a device cross-sectional flow diagram (a barrier metal film formation step) at a trench gate cell portion in a manufacturing method of a semiconductor device according to another embodiment of the present application.

FIG. 15 is a device cross-sectional flow diagram (a step of forming a barrier metal film) at a trench gate cell portion in a manufacturing method of a semiconductor device according to another embodiment of the present application. In this process, a tungsten-based barrier metal film 23 (TiW film) is formed over the whole thickness by carrying out ionization sputtering film formation such as PCM sputtering film formation while applying a bias to the wafer side.

The film is formed, for example, under the following conditions: a film thickness of about 250 nm, a sputtering time for about 100 seconds, a degree of vacuum at about 18 Pascal, an argon flow rate at about 175 sccm, a temperature of the stage at room temperature (for example, the wafer is gas cooled with an electrostatic chuck ON), a target-side high-frequency power at about 4000 W (for example, 60 MHz), a wafer-side high-frequency power at about 400 W (for example, 13.56 MHz), a target-side DC bias voltage OFF (when the film formation rate is insufficient, application of a bias improves the rate), and a target composition having 10% titanium and 90% tungsten (wt. %).

This one-stage barrier metal film formation process enables to decrease the whole film thickness because the entirety of the tungsten-based barrier metal film 23 (TiW film) thus obtained is in an amorphous form with a good barrier property.

On the other hand, according to the two-stage barrier metal film formation process explained in Section 3, the lower-layer barrier metal film (first layer film) 23a is in an amorphous form with a good barrier property so that it acts as a good barrier against diffusion of aluminum. The upper-layer barrier metal film (second layer film) 23b, on the other hand, is in the form of a columnar grain with inferior barrier property, but a conventionally proven good reflow property of it to aluminum can be utilized advantageously.

5. Explanation on the data showing the cross-sectional shape of the power MOSFET manufactured using the manufacturing method of a semiconductor device according to the one embodiment of the present application and conclusion on the present application as a whole (mainly FIG. 18)

Figure 18:
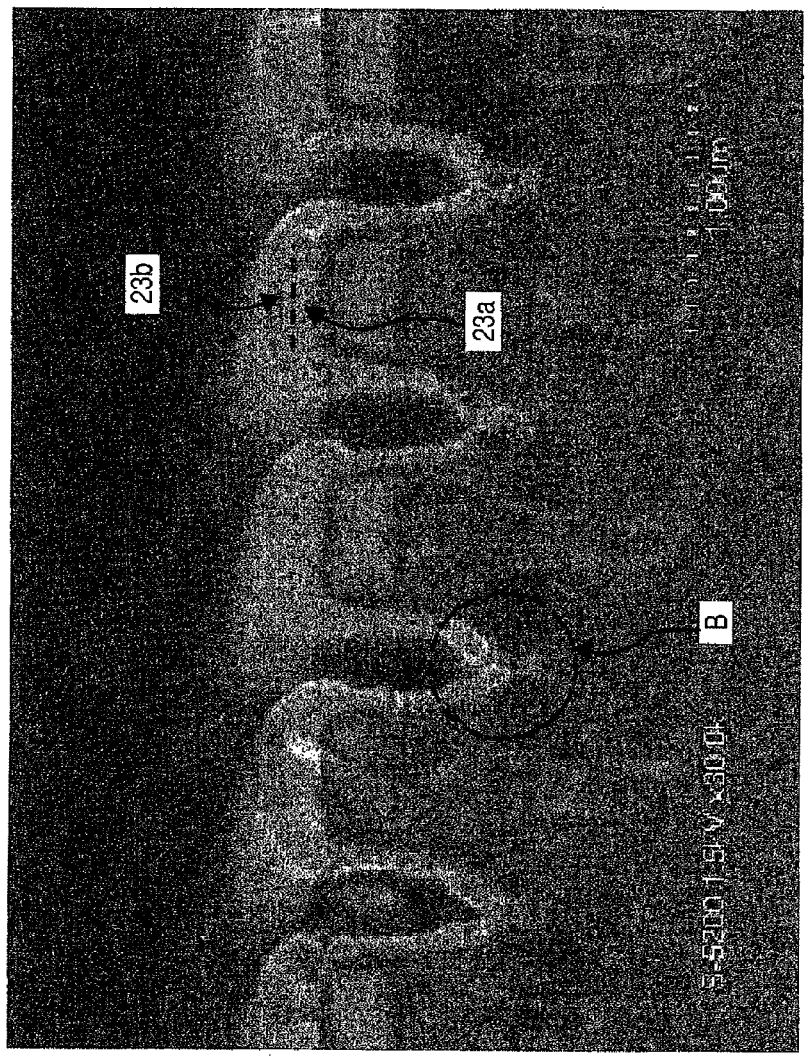
FIG. 18 is an SEM (scanning electron microscope) photograph corresponding to FIG. 13.

FIG. 18 is an SEM (scanning electron microscope) photograph corresponding to FIG. 13, more specifically, a cross-sectional shape of the cell region (trench gate cell portion) 12 of the power MOSFET manufactured using the two-stage barrier metal film formation process explained in Section 3. From the drawing, it is apparent that the trench bottom portion B, which is the bottom portion of the recess (source contact trench) having a two-stage structure, is almost completely filled. Comparison between the upper-layer barrier metal 23b and the lower-layer barrier metal film 23a over the interlayer insulating film 21 (FIG. 13) suggests that the grain of the upper-layer barrier metal 23b is in the column form.

According to the analysis by the present inventors, deterioration in the barrier property is presumed to occur because a space is likely to appear at the boundary among columnar grains (columnar crystals) at portions where the background is outwardly convex. It is presumed that in the barrier metal film in the amorphous form, the boundary of the grains does not act as a high-speed diffusion path so that such a barrier metal film exhibits a good barrier property. No such problem due to columnar grains occurs in a titanium-based barrier metal (TiN or the like) comprised mainly of titanium because it has a dense structure. A device incorporating an SBD should use a tungsten-based barrier metal in order to secure the properties of the SBD and in addition, the device can be manufactured more easily when a tungsten-based barrier metal is used than when a titanium-based barrier metal, from the standpoint of the warpage of the wafer or the like.

In ionization sputtering film formation, application of a bias power to the wafer side provides a film in an amorphous form, because the grain structure is converted to the amorphous structure due to a high energy of incident metal particles. In addition, application of a bias power to the wafer side causes re-sputtering on the bottom of the recess (source contact trench) 22 and re-deposition onto the side surface of the bottom improves the flattening processing.

Data analysis by the present inventors has revealed that in the formation of a barrier metal film by using various methods described in Sections 3 and 4, warpage of the wafer is reduced compared with the wafer manufactured using the conventional non-ionization sputtering film formation (for example, typical long throw sputtering). Described specifically, when an average warpage amount is compared immediately after silicidation annealing, that of a wafer obtained using non-ionization sputtering film formation is about 68.26 w, while that of a wafer obtained using the two-stage system described in Section 3 is about 39.56 w.

6. Summary

The invention made by the present inventors was described specifically based on some embodiments. The present invention is not limited to them. It is needless to say that it can be modified without departing from the scope of the invention.

For example, in the above-described embodiments, the invention was specifically described using a power MOSFET as an example. It is needless to say that the invention is not limited to it but it can be applied widely not only to simple elements such as IGBT but also integrated circuit devices including them.

In the above-described embodiments, N-channel type devices such as N-channel type power MOSFET were described specifically. It is needless to say that the present invention is not limited to them but can be applied to P-channel type devices such as P-channel type power MOSFET. In this case, it is only necessary to carry out a PN reversing operation for completely interchanging P and N.

In the above-described embodiment, a sputtering film formation method was described mainly as the formation method of a metal member film. It is needless to say that the invention is not limited to it and a film formation method such as CVD or plating can be employed as needed.

What is claimed is:

1. A manufacturing method of a semiconductor device comprising the steps of:
   (a) providing a wafer stage;
   (b) supporting a semiconductor wafer, having a first surface, on the wafer stage;
   (c) providing an insulating film formed over the first surface of the semiconductor wafer and having an insulating film upper surface;
   (d) forming a recess extending downwards from the insulating film upper surface and with the so-formed recess having a recess inner surface;
   (e1) forming a first-layer film of a tungsten-containing barrier metal film and having a first-layer film inner surface directly contacting the recess inner surface of the recess and also directly contacting the upper surface of the first insulating film and having a first-layer film outer surface;
   (e2) forming the first-layer film of the tungsten-containing barrier metal film using ionization sputtering film formation while applying a bias voltage to the semiconductor wafer resulting in the first-layer film of the tungsten-containing barrier metal film having an amorphous structure with barrier properties;
   (e3) forming a second-layer film of the tungsten-containing barrier metal film having a second-layer film inner surface directly contacting the outer surface of the first-layer film of the tungsten-containing barrier metal film and having a second-layer film outer surface;
   (e4) forming the second-layer film of the tungsten-containing barrier metal film using ionization sputtering film formation, without substantially applying a bias voltage to the semiconductor wafer resulting in the second-layer film of the tungsten containing barrier metal film having a columnar crystal structure with a reflow property to aluminum;
   (f) after the steps (e1), (e2), (e3) and (e4), forming a seed aluminum-containing metal film having an inner surface covering the outer surface of the second-layer tungsten-containing barrier metal film which was formed over the first layer film of the tungsten-containing barrier metal film directly contacting the inner surface of the recess and the upper surface of the first insulating film, with the seed aluminum-containing metal film having an upper surface;
   (g) forming the seed aluminum-containing metal film using ionization sputtering film formation, while applying a bias voltage to the semiconductor wafer, and while setting a temperature of the wafer stage between 400° C. and 440° C., resulting in the seed aluminum-containing metal film not closing an upper portion of the recess; and
   (h) forming an aluminum-containing metal film covering the upper surface of the seed aluminum-containing metal film using ionization sputtering film formation, without substantially applying a bias voltage to the semiconductor wafer resulting in the aluminum-containing metal film filling the recess and covering the second-layer film of the tungsten-containing barrier metal film outside the recess.

2. The manufacturing method of a semiconductor device according to claim 1, further including providing the tungsten-containing barrier metal film containing tungsten as a first component thereof and titanium as a second component thereof.

3. The manufacturing method of a semiconductor device according to claim 1, further including performing steps (e1), (e2), (e3), (e4), (f) and (g) in a single film forming chamber.

4. The manufacturing method of a semiconductor device according to claim 1, further including performing the steps (e1), (e2), (e3), (e4), (f) and (g) in film forming chambers different from each other.

5. The manufacturing method of a semiconductor device according to claim 1, wherein the semiconductor wafer has, over the first surface thereof, a number of semiconductor chip regions, and further has a Schottky barrier diode formed in each of the number of semiconductor chip regions.

6. The manufacturing method of a semiconductor device according to claim 1, wherein a power MOSFET is formed in each of the number of semiconductor chip regions.

7. The manufacturing method of a semiconductor device according to claim 1, wherein the recess has a two-stage structure.

* * * * *